United States Patent
Coakley

(10) Patent No.: US 8,975,510 B2
(45) Date of Patent: Mar. 10, 2015

(54) FOIL-BASED INTERCONNECT FOR REAR-CONTACT SOLAR CELLS

(75) Inventor: Kevin Michael Coakley, Palo Alto, CA (US)

(73) Assignee: CelLink Corporation, Belmont, CA (US)

( * ) Notice: Subject to any disclaimer, the term of this patent is extended or adjusted under 35 U.S.C. 154(b) by 250 days.

(21) Appl. No.: 13/429,030

(22) Filed: Mar. 23, 2012

(65) Prior Publication Data

US 2012/0240995 A1    Sep. 27, 2012

Related U.S. Application Data

(60) Provisional application No. 61/467,948, filed on Mar. 25, 2011, provisional application No. 61/553,764, filed on Oct. 31, 2011.

(51) Int. Cl.
*H01L 31/0224* (2006.01)
*H01L 31/05* (2014.01)
*H01L 31/02* (2006.01)

(52) U.S. Cl.
CPC ........ *H01L 31/0516* (2013.01); *H01L 31/0201* (2013.01); *Y02E 10/50* (2013.01)
USPC .............................. 136/256; 438/73; 136/244

(58) Field of Classification Search
USPC ................................................ 136/242–265
See application file for complete search history.

(56) References Cited

U.S. PATENT DOCUMENTS

| | | | |
|---|---|---|---|
| 3,903,427 A | 9/1975 | Pack | |
| 3,903,428 A | 9/1975 | DeJong | |
| 4,234,352 A | 11/1980 | Swanson et al. | |
| 4,927,770 A | 5/1990 | Swanson | |
| 5,053,083 A | 10/1991 | Sinton | |
| 6,160,215 A | 12/2000 | Curtin | |
| 6,500,731 B1 | 12/2002 | Nakagawa et al. | |
| 7,276,724 B2 | 10/2007 | Sheats et al. | |
| 2007/0062573 A1 | 3/2007 | Ferri et al. | |
| 2009/0256254 A1 | 10/2009 | Burdick, Jr. et al. | |
| 2009/0301543 A1 | 12/2009 | Reddy et al. | |
| 2009/0314346 A1 | 12/2009 | Hishida | |

(Continued)

FOREIGN PATENT DOCUMENTS

WO    2013066884 A1    5/2013

OTHER PUBLICATIONS

Van Kerschaver et al., Progress in Photovoltaics: Research and Applications, Back-contact Solar Cells: A Review, Wiley InterScience, 2005.

(Continued)

*Primary Examiner* — Keith Hendricks
*Assistant Examiner* — Kourtney S Carlson
(74) *Attorney, Agent, or Firm* — Kwan & Olynick LLP

(57) ABSTRACT

A rear-contact solar cell interconnect is disclosed. The rear-contact solar cell interconnect includes a first conductive foil with an opening and a second conductive foil. The first conductive foil is arranged to be electrically connected to a first polarity contact of a solar cell. The second conductive foil is arranged to be electrically connected to a second polarity contact of the solar cell through the opening of the first conductive foil. The solar cell includes a first surface arranged to receive solar irradiation and a second surface substantially opposite the first surface. The first polarity contact and the second polarity contact are provided on the second surface of the solar cell.

22 Claims, 28 Drawing Sheets

(56) References Cited

U.S. PATENT DOCUMENTS

| | | |
|---|---|---|
| 2010/0012172 A1 | 1/2010 | Meakin et al. |
| 2010/0024881 A1 | 2/2010 | Hacke et al. |
| 2010/0051085 A1 | 3/2010 | Weidman et al. |
| 2010/0139746 A1 | 6/2010 | Von Maydell et al. |
| 2010/0186804 A1 | 7/2010 | Cornfeld |
| 2010/0300528 A1 | 12/2010 | Fujii |
| 2011/0067751 A1 | 3/2011 | Meakin et al. |
| 2011/0139210 A1* | 6/2011 | Hong et al. .................... 136/244 |
| 2012/0000511 A1* | 1/2012 | Gee et al. ...................... 136/249 |
| 2012/0103388 A1* | 5/2012 | Meakin et al. ................ 136/244 |
| 2013/0112233 A1 | 5/2013 | Coakley |

OTHER PUBLICATIONS

"Int'l Application Serial No. PCT/US12/62604, Search Report mailed Jan. 17, 2013".

\* cited by examiner

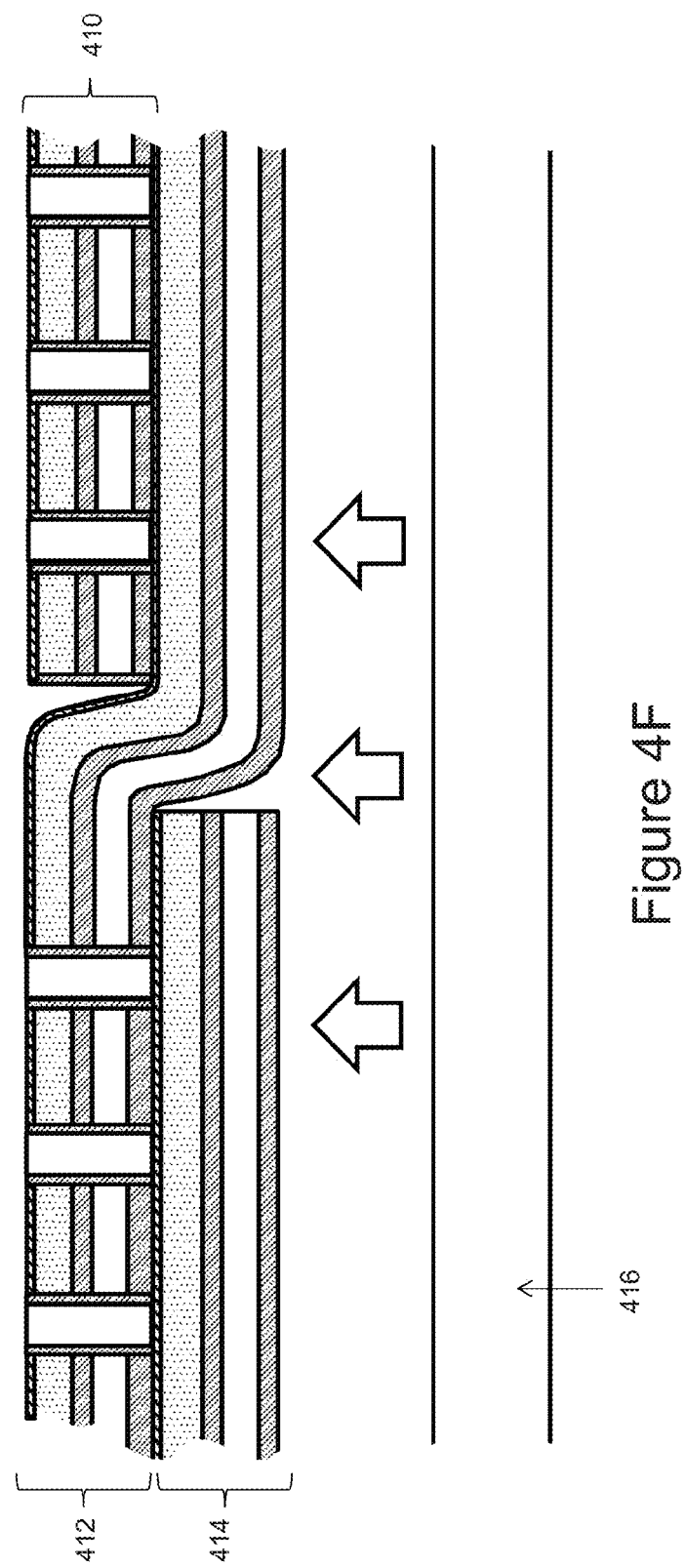

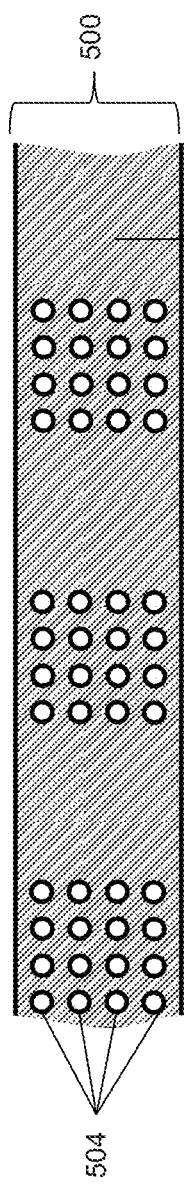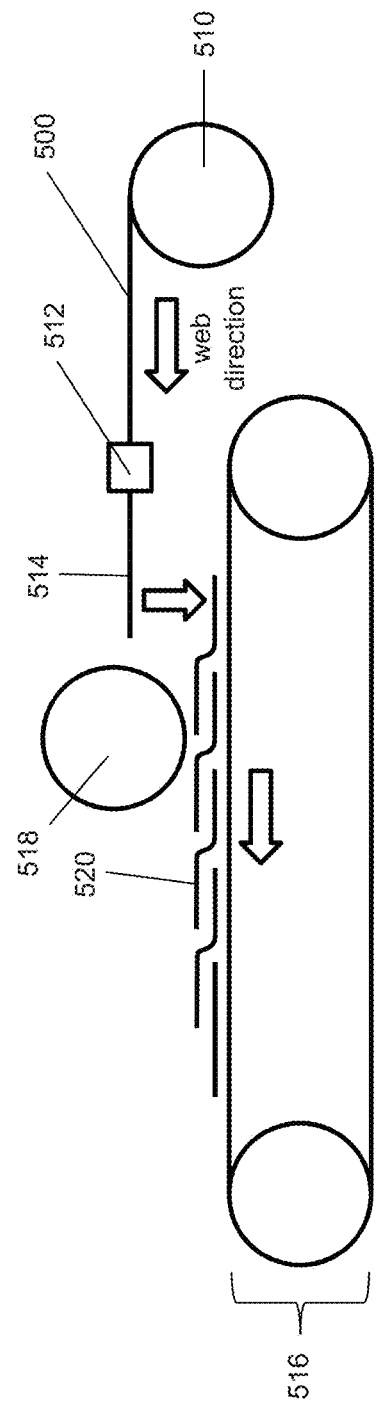
Figure 5A
Figure 5B

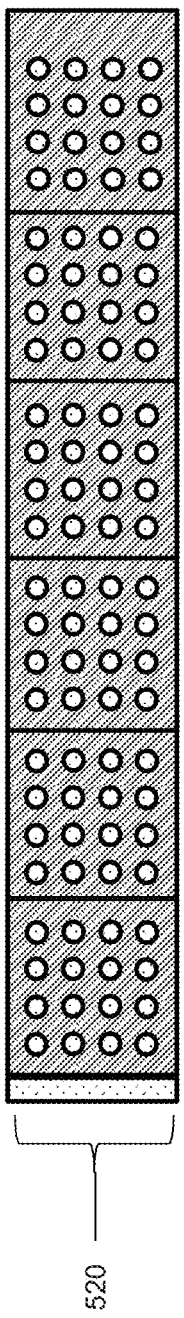
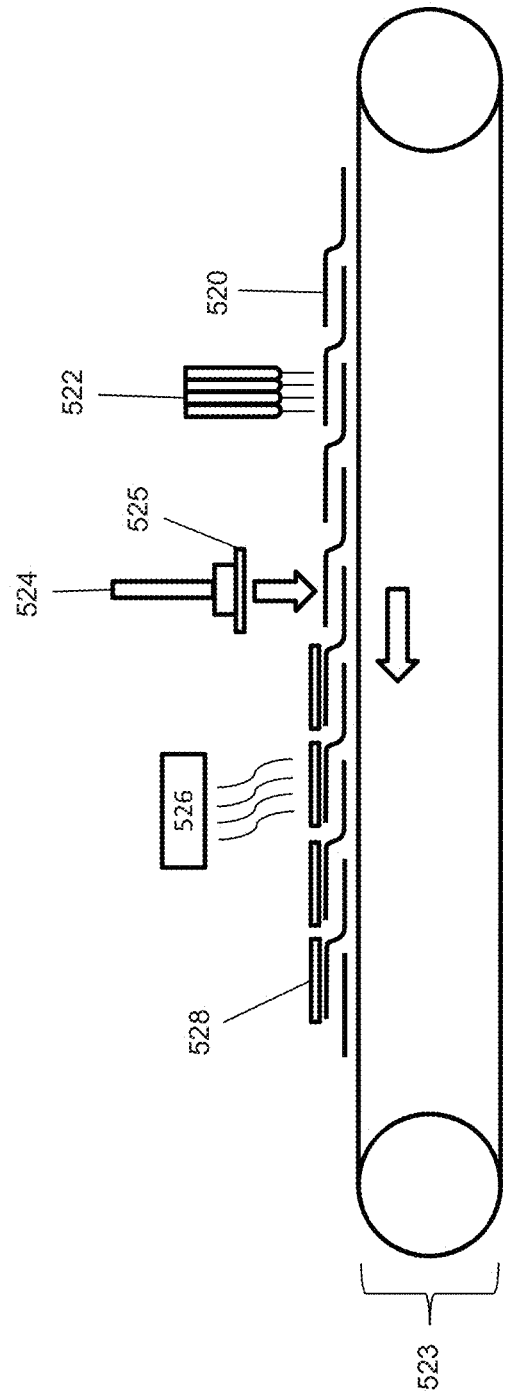
Figure 5C
Figure 5D

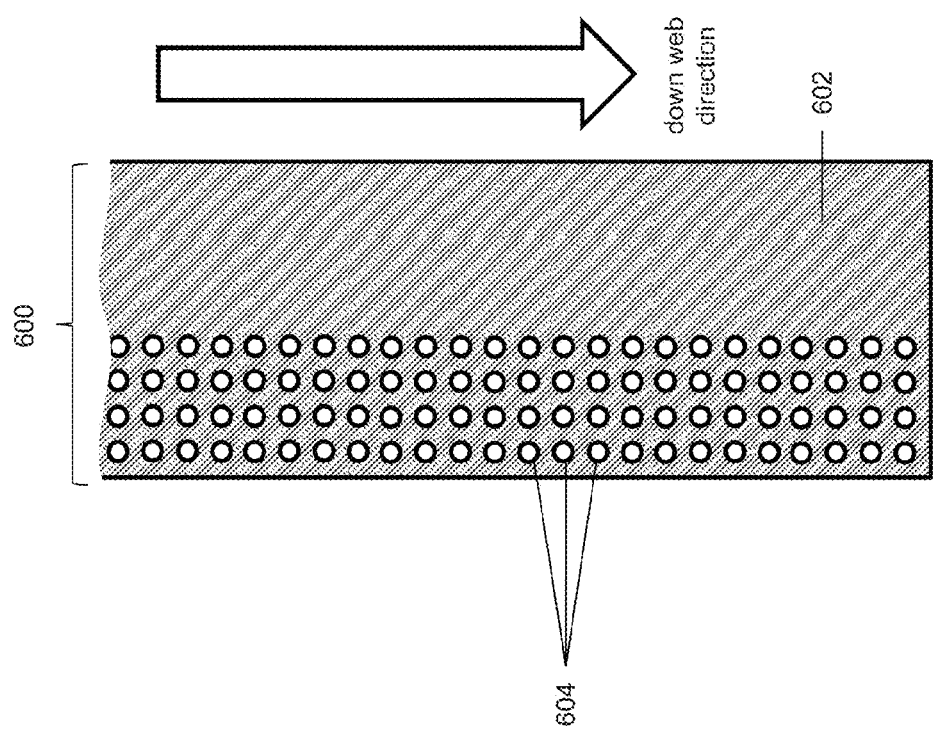

FOIL-BASED INTERCONNECT FOR REAR-CONTACT SOLAR CELLS

CROSS REFERENCE TO OTHER APPLICATIONS

This application claims priority to U.S. Provisional Patent Application No. 61/467,948 entitled FOIL-BASED INTERCONNECT FOR REAR-CONTACT SOLAR CELLS filed Mar. 25, 2011 and to U.S. Provisional Patent Application No. 61/553,764 entitled FOIL-BASED INTERCONNECT FOR REAR-CONTACT SOLAR CELLS filed Oct. 31, 2011, which are both incorporated herein by reference for all purposes.

BACKGROUND OF THE INVENTION

In order to increase the efficiency and decrease the manufacturing cost of photovoltaic (PV) cells, significant efforts have been made to develop rear-contact solar cells in which both the positive and negative polarity contacts of the solar cell are accessible from the rear, or non-light-incident, side of the cell. Compared to traditional front-contact solar cells, rear-contact solar cells typically have less or in some cases no metal coverage of the cell's front surface. This circumvents the tradeoff that occurs in front-contact cells between the conductance of metallic front electrodes and their coverage (or shadowing) of the cell's light-incident side, leading to better optical in-coupling, lower resistive power loss, and higher conversion efficiency. Examples of rear-contact solar cells may be found in U.S. Pat. Nos. 3,903,427, 3,903,428, 4,927,770, 5,053,083, 7,276,724, and US patent applications US2009/0314346, US2010/0139746, and US2009/0256254. A thorough review of silicon-based rear-contact solar cell technology may be found in Prog. Photovolt: Res. Appl. 2006; 14:107-123.

In addition to providing higher efficiency, there are at least two other ways in which the incorporation of rear-contact solar cells can simplify and reduce the cost of manufacturing PV modules. First, in a rear-contact PV module production line, it may be possible to replace the tabbing and stringing operation required in front-contact PV modules with a simple placement step in which rear-contact cells are directly connected to an electrically functional interconnect backsheet just prior to module lamination. This can help enhance the overall throughput of the production line. Second, for silicon-based PV cells, rear-contact PV modules are typically better-suited than front-contact PV modules to the incorporation of thin, large cells because front-contact silicon cells may develop a large coefficient of thermal expansion (CTE) mismatch stress when thick current-collecting tabs are soldered on to them. This CTE mismatch stress and associated cell breakage is particularly problematic if the cells are thinner than about 200 microns or larger than about 156 millimeters on a side. By contrast, the need for thick metallic conductors is significantly reduced in rear-contact solar cells because the output current is typically distributed across the back surface of the cell. This enables thinner, wider metallic conductors to be attached to the back of rear-contact cells with lower ohmic power loss and reduced breakage from CTE mismatch stress.

At present, however, several factors related to the difficulty in interconnecting rear-contact solar cells have limited their widespread implementation. For example, in many rear-contact solar cell architectures, it is desirable to have a contact size and spacing on the order of a few millimeters on the cell's rear surface, while the interconnected assembly of rear-contact solar cells is generally 1 m$^2$ or larger in a finished PV module. It is very difficult to fabricate a single circuit or device that can accommodate both of these dimensional requirements with high yield and low cost. Large-area "conductive backsheets" typically utilize a layer of interdigitated positive and negative electrodes disposed just below the rear-contact solar cells (see, for example, US Patent App. No. 2010/0012172). In many cases, the production cost of these conductive backsheets is so high that their use in PV modules becomes impractical. The high cost can be attributed in part to the relative lack of availability of screen printing and etching equipment that can handle 0.5-2 m wide rolls of material, and in part to the stringent material quality required to ensure that circuit patterns this large retain their dimensional stability to within a few millimeters.

In addition, achieving sufficient long-term reliability from rear-contact solar modules incorporating large-area conductive backsheets has been a challenge. For example, these devices may be prone to electrical shorting during fabrication and/or long-term outdoor exposure if an electrode of one polarity on the conductive backsheet touches an electrode of the opposite polarity on a rear-contact solar cell. Furthermore, in some cases mechanical stress arising from CTE mismatch between the rear-contact solar cells and the conductive backsheet may be amplified due to the fact that the conductive backsheet is generally much larger than the solar cells. Expansion and contraction of the conductive backsheet relative to the solar cells and the front glass cover sheet can cause large shear stresses to form on materials such as solder or electrically conductive adhesive that are used to make electrical connections between the solar cells and the conductive backsheet. Over time this may lead to fatigue and/or failure of these electrical connections in the field. Therefore, there exists a need for an improved interconnect for rear-contact solar cells.

BRIEF DESCRIPTION OF THE DRAWINGS

Various embodiments of the invention are disclosed in the following detailed description and the accompanying drawings.

FIGS. 4A-4I are sequential cross-sectional schematic diagrams illustrating examples of the fabrication of an assembly of interconnected rear-contact solar cells.

FIG. 5A is a diagram illustrating an example of a continuous sheet that may be used in the production of a rear-contact PV module.

FIG. 5B is a diagram illustrating an example of an apparatus that may be used in the production of a rear-contact PV module.

FIG. 5C is a diagram illustrating an example of an interconnect string.

FIG. 5D is a diagram illustrating an example of an apparatus that may be used to connect rear-contact PV cells to interconnect strings.

FIGS. 6A-6E are sequential diagrams showing examples of the production of an electrically-functional interconnect backsheet.

DETAILED DESCRIPTION

Figure 1:
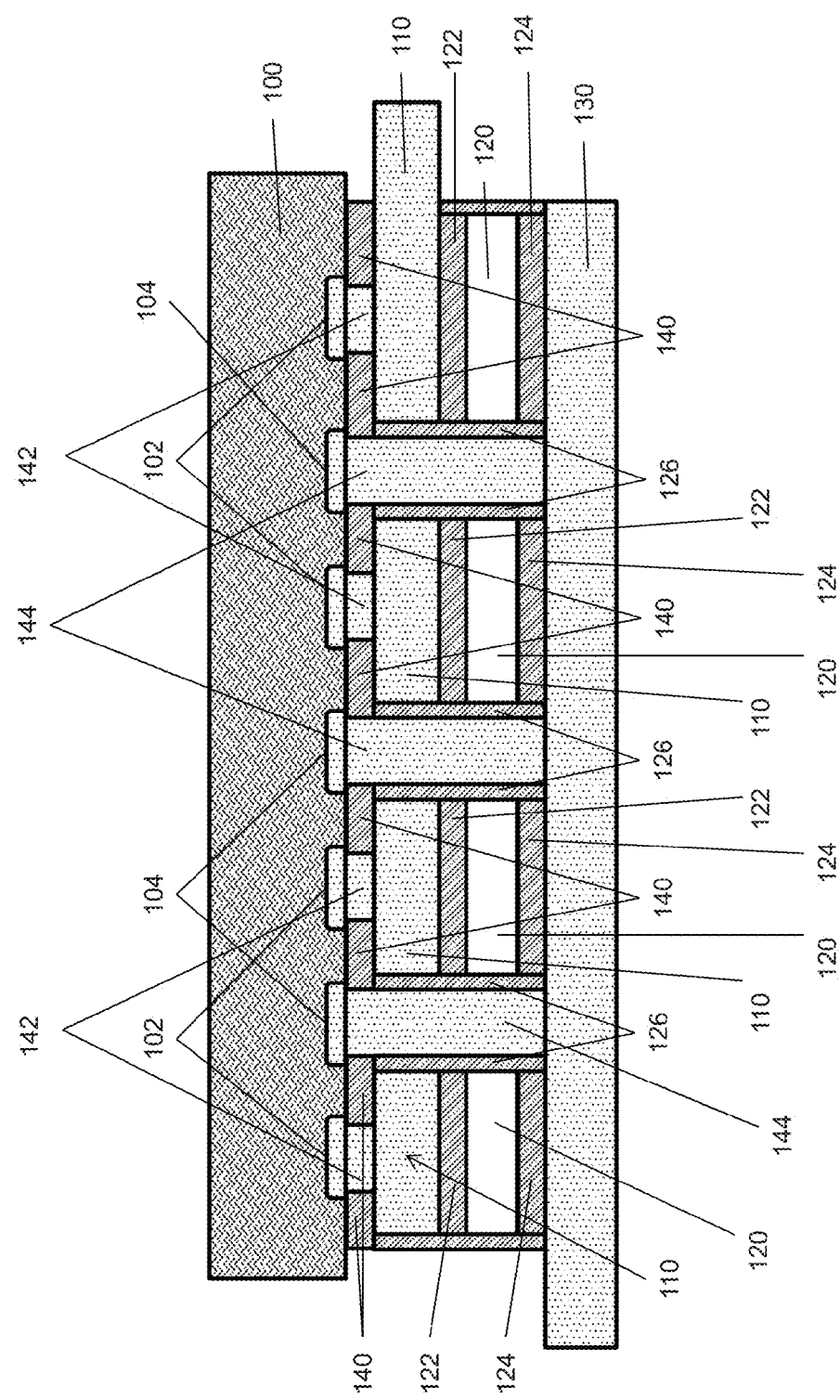
FIG. 1 is a diagram illustrating an example of a rear-contact solar cell assembly.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

To more clearly illustrate the embodiments and examples, not all parts of the schematic views shown in the figures have been labeled. Although many instances of a given object may be shown in a figure, only a portion of the instances of the given object may be labeled to simplify the drawing and illustrate the embodiment more clearly. An unlabeled instance of an object that corresponds to a labeled instance of the object is referred to in the Specification using the identifier of the labeled object.

In one embodiment, a set of conductive foil sheets and insulating layers are configured to interconnect rear-contact solar cells. Each of these rear-contact solar cells has its positive and negative polarity contacts connected to different sheets of conductive foil. The first polarity contacts, for example the positive polarity contacts, are electrically connected directly to a first conductive foil, an insulating layer is disposed between the first conductive foil and a second conductive foil to prevent electrical shorts, and the second polarity contacts, for example the negative polarity contacts, are electrically connected to the second conductive foil through a set of holes in the first conductive foil and the insulating layer. In some embodiments, each sheet of conductive foil is extended lengthwise to electrically connect the positive polarity contacts of a first rear-contact solar cell with the negative polarity contacts of a second, adjacent rear-contact cell. This pattern of partially overlapping conductive foil sheets may be repeated throughout a solar module to electrically interconnect rear-contact solar cells.

In some embodiments, a series of conductive foil sheets and insulating layers are incorporated together using roll-to-roll processing techniques to form an interconnect prior to the connection of the rear-contact cells. In some embodiments, the conductive foil sheets and insulating layers are integrated into a photovoltaic (PV) module backsheet prior to attachment of the rear-contact solar cells to simplify module manufacturing and improve yield. These embodiments may have the benefit of improving the throughput and reducing the manufacturing cost of the PV module.

In some embodiments, a rear-contact solar cell assembly comprises a rear-contact solar cell, a first conductive foil with an array of gaps or holes, an insulating layer with an array of gaps or holes that at least partially overlaps the array of gaps or holes in the first conductive foil, and a second conductive foil. The rear-contact solar cell assembly further comprises a set of electrical connections made between the first polarity contacts on the rear side of the silicon solar cell and the first conductive foil, and a second set of electrical connections made between the second polarity contacts on the rear side of the silicon solar cell and the second conductive foil, wherein the second set of electrical connections is made through the arrays of gaps or holes in the first conductive foil and the insulating layer.

FIG. 1 is a diagram illustrating an example of a rear-contact solar cell assembly. The assembly includes a rear-contact solar cell 100 with first polarity contacts 102 and second polarity contacts 104. The assembly also includes a first conductive foil 110 and a second conductive foil 130. An insulating layer 120 is disposed between the conductive foils 110 and 130. In some embodiments, the insulating layer 120 is attached to the conductive foils 110 and 130 with first and second adhesive layers 122 and 124, respectively. The first polarity contacts 102 are electrically connected to the first conductive foil 110 through first electrical connections 142. In some embodiments, to provide additional mechanical strength to the assembly, a third adhesive layer 140 may optionally be used to bond the rear-contact solar cell 100 to the first conductive foil 110 in regions where there are no electrical connections between the rear-contact solar cell 100 and the conductive foils 110 and 130.

As shown in FIG. 1, both the first conductive foil 110 and the insulating layer 120 are patterned to provide overlapping gaps or overlapping holes. In some embodiments, the gaps or holes allow second electrical connections 144 to be made between the second polarity contacts 104 and the second conductive foil 130. In some embodiments, an insulating sidewall coating 126 covers at least a portion of the edges of the gaps or holes to prevent electrical shorts between the second electrical connections 144 and the first conductive foil 110, and/or between the edges of the first conductive foil 110 and the second conductive foil 130. In some embodiments, the sidewall coating 126 comprises the adhesive material of adhesive layer 122, adhesive layer 124, and/or adhesive layer 140. In some embodiments, a critical feature size of second electrical connections 144 may be 25-50% smaller than a width of the gaps or holes of first conductive foil 110. This may enable second the electrical connections 144 to pass through the first conductive foil 110 with a clearance between the first conductive foil 110 and the second electrical connections 144. For example, in various embodiments, the first polarity contacts 102 and the second polarity contacts 104 may be substantially circular with a diameter between approximately 1-5 mm, the second electrical connections 144 are substantially circular with a typical diameter approximately between 1-4 mm (e.g., absolute range between 0.5-5 mm), and the holes in the first conductive foil 110 have a diameter that is approximately 2 mm larger than the diameter of the second electrical connection 144.

The rear-contact solar cell assembly shown in FIG. 1 may comprise any type of rear-contact solar cell 100 in which both the first and second polarity contacts 102 and 104, respectively, are accessible from the non-light-incident surface of the solar cell. In some embodiments, the first polarity contacts 102 may be positively charged and the second polarity contacts 104 may be negatively charged when the rear-contact solar cell is illuminated, while in other embodiments the polarities of the first and second polarity contacts 102, 104 may be reversed. In some embodiments, rear-contact solar cell 100 includes mono- or multi-crystalline silicon wafers. Examples of silicon rear-contact solar cells include, but are not limited to, metal wrap-through cells, emitter wrap-through cells, back junction cells, all-back-contact cells, interdigitated back-contact cells, rear-contact-adapted passivated emitter rear locally-diffused cells, rear point-contact cells, and rear-contact-adapted silicon heterojunction (also known as heterojunction with intrinsic thin layer, or HIT) cells. The first conductive foil 110 and insulating layer 120 may be patterned so that virtually any geometry of first and second polarity contacts 102 and 104 can be electrically connected with the first and second conductive foils 110 and 130, respectively. In some embodiments, the rear-contact solar cell 100 includes second polarity contacts 104 that are localized to points or relatively small regions of the rear surface of the rear-contact solar cell 100. This allows the second electrical connections 144 to be made through a relatively simple array of holes in the first conductive foil 110 and the insulating layer 120.

In some embodiments, conductive foils 110 and 130 comprise any sufficiently conductive material that can withstand typical process and field exposure conditions for a PV module. Metals suitable for the conductive foils 110 and 130 include, but are not limited to, aluminum, copper, steel, titanium, molybdenum, tungsten, and alloys thereof. In some embodiments, the thickness of the conductive foils 110 and 130 are large enough to provide a current path with low electrical resistance, yet not so large that excessively high CTE mismatch stress is generated in the finished assembly. In the case of aluminum or copper foils, a thickness in the range of 10-200 μm is generally sufficient to satisfy these criteria. In some embodiments, a foil thickness in the range of 25-100 μm may be preferred. In some embodiments, the conductive foils 110 and 130 are selectively oxidized using, for example, photo-anodization to provide a protective insulating layer of metal oxide in regions of the foil that are not in direct contact with the electrical connections 142 and 144, respectively.

In some embodiments, the conductive foils 110 and 130 may be coated with a surface finish material before incorporation into the rear-contact solar cell assembly. The surface finish material may provide a stable, solderable surface and prevent long-term oxidation at the interface between the conductive foils 110 and 130 and the first and second electrical connections 142 and 144, respectively. Examples of surface finish materials that may provide a suitable surface include tin, lead, nickel, silver, palladium, gold, indium, and alloys thereof. In various embodiments, the surface finish material may be plated, sputtered, and/or applied via other means. With certain conductive foils (e.g., with conductive foils comprising aluminum) it may be preferable to remove the native oxide from the foil surface before applying the surface finish material. In some embodiments, this may help provide the conductive foil with low contact resistance and good environmental stability.

The insulating layer 120 electrically isolates the conductive foils 110 and 130 and may help reduce thermo-mechanical stress in the rear-contact solar cell assembly if it has a suitable CTE. In some embodiments, the insulating layer 120 comprises a polymer or spin-on glass that can be coated (e.g., using a solution) onto the first conductive foil 110 or the second conductive foil 130. This may simplify fabrication of the rear-contact solar cell assembly by eliminating the need to separately apply the first adhesive layer 122 between the insulating layer 120 and the conductive foil 110. Techniques that may be used to coat the insulating layer 120 directly onto the first conductive foil 110 or the second conductive foil 130 include, but are not limited to, screen printing, gravure printing, slot coating, inkjet printing, doctor blade coating, and spray coating. In some embodiments, if the first conductive foil 110 is patterned with gaps or holes prior to being coated with a solution forming the insulating layer 120, the rheology of the coating solution may be chosen so that the insulating layer 120 coats the edges of the gaps or holes in the first conductive foil 110 as well as the surface of the first conductive foil 110. In this embodiment, the insulating layer 120 and the insulator sidewall coating 126 may comprise the same material and be applied in the same process step. In some embodiments, the insulating layer 120 resists moisture and oxygen permeation in order to protect the electrical connections 142 and 144 from oxidation.

In some embodiments, the insulating layer 120 is processed in sheet form and is subsequently laminated to the conductive foils 110 and 130 using the first and second adhesive layers 122 and 124. Examples of sheet materials that may be suitable for the insulating layer 120 include, but are not limited to, polyimide (PI), polyethylene naphthalate (PEN), polyethylene terephthalate (PET), polymethyl methacrylate (PMMA), ethyl vinyl acetate (EVA), or polyvinyl butyral (PVB). In some embodiments, the insulating layer 120 is sufficiently thick and electrically resistive to prevent shunting between the conductive foils 110 and 130. In some embodiments, the insulating layer 120 comprises PET, which may optionally be provided as the insulating layer in pre-assembled conductive foil/PET laminates. These laminates may be available at low cost due to their widespread use in space satellites, cable shielding, flex circuits, and other applications.

In some embodiments, if the insulating layer 120 is processed in sheet form, it may be preferable to laminate the first conductive foil 110 to the insulating layer 120 prior to creating gaps or holes in the two layers. In some embodiments, because it is generally desirable for the gaps or holes in the first conductive foil 110 and the insulating layer 120 to at least partially overlap to allow for the second electrical connections 144 to extend from the second polarity contacts 104 to the second conductive foil 130, it may be possible to simplify production of the rear-contact solar cell assembly by first laminating the first conductive foil 110 and insulating layer 120 together using the first adhesive layer 122, and then subsequently forming self-aligned holes in the first conductive foil 110, insulating layer 120 and first adhesive layer 122 with a single removal step such as mechanical punching or laser drilling.

In some embodiments, it may be advantageous to create the gaps or holes in the first conductive foil 110 and the gaps or holes in the insulating layer 120 in separate steps. For example, it may be possible to improve the electrical isolation between the first conductive foil 110 and the second electrical connections 144 by making the size of the gaps or holes in the first conductive foil 110 larger than the gaps or holes in the insulating layer 120.

The second adhesive layer 124 attaches the second conductive foil 130 to the insulating layer 120. The second adhesive layer 124 is applied in such a way that leaves the surface of the second conductive foil 130 exposed at the bottom of each gap or hole in the first conductive foil 110 and the insulating layer 120. The second adhesive layer 124 may be first applied to either the bottom surface of the insulating layer 120 or the top surface of the second conductive foil 130. It may be desirable for the second adhesive layer 124 to exhibit resistance to moisture and oxygen permeation in order to protect the electrical connections 142 and 144 from oxidation. In various embodiments, the second adhesive layer 124 comprises one or more of the following: a hot melt adhesive, pressure sensitive adhesive, B-stage adhesive, thermoset adhesive, thermoplastic adhesive, cross-linking adhesive, or some other adhesive type.

In some embodiments, the second adhesive layer 124 comprises a pre-patterned sheet or a patterned coated material. If the second adhesive layer 124 is a pre-patterned sheet or a patterned coating, it may be advantageous to make the size of the gaps or holes in the second adhesive layer 124 smaller than the critical feature size or diameter of the gaps or holes in the first conductive foils 110. This may help improve the electrical isolation between the first conductive foil 110 and the second electrical connections 144.

In some embodiments, the second adhesive layer 124 comprises a coated material that is first applied to the insulating layer 120. Techniques that may be used to coat the second adhesive layer 124 onto the insulating layer 120 include, but are not limited to, screen printing, gravure printing, slot coating, inkjet printing, doctor blade coating, and spray coating. It may be possible to modify the rheology of the second adhesive layer 124 so that it coats the edges of the gaps or holes in the insulating layer 120 and the first conductive foil 110 as well as the bulk of the rear surface of the insulating layer 120. In this example, the second adhesive layer 124 and the optional insulating sidewall coating 126 are substantially composed of the same material and are applied in the same process step.

In some embodiments, the second adhesive layer 124 is first applied to the upper surface of the second conductive foil 130 using a printing or laminating technique that leaves openings in the second adhesive layer 124 where gaps or holes are present in the first conductive foil 110, the first adhesive layer 122, and the insulating layer 120. In some embodiments, the electrical isolation between the first conductive foil 110 and the second electrical connections 144 is at least partially improved by making the size or diameter of the openings in the second adhesive layer 124 smaller than the critical feature size or diameter of the gaps or holes in the first conductive foil 110.

In some embodiments, the insulating sidewall coating 126 is applied using a dedicated process step. Techniques that may be used to coat the insulating sidewall coating 126 onto the edges of the gaps or holes in the first conductive foil 110 and the insulating layer 120 include, but are not limited to, screen printing, gravure printing, inkjet printing, lithographic patterning, and spray coating.

The first and second electrical connections 142 and 144 provide an electrically conductive pathway between the first and second conductive foils 110 and 130 and the first and second polarity contacts 102 and 104, respectively. The critical feature size or diameter of the second electrical connections 144 may intentionally be made slightly smaller than the critical feature size or diameter of the gaps or holes in the first conductive foil 110. This offset may help prevent electrical shorts between the second electrical connections 144 and the first conductive foil 110. In some embodiments, first and second electrical connections 142 and 144 comprise any material that is capable of providing a low-resistance, highly-reliable electrical contact to both the first and second polarity contacts 102 and 104 and the conductive foils 110 and 130, respectively. Materials which may fulfill this function include, but are not limited to, solders, conductive inks, isotropic electrically conductive adhesives (ECAs), anisotropic electrically conductive adhesives, and bulk metallic conductors. It may be preferable for the materials comprising the first and second electrical connections 142 and 144 to be resistant to interfacial and bulk oxidation in the event that these regions are exposed to oxygen or moisture during module operation. In some embodiments, the first and second electrical connections 142 and 144 comprise a printable material such as solder paste or silver flake-filled, epoxy-based ECA.

In some embodiments, first and second electrical connections 142 and 144 are tolerant to shear stress arising from CTE mismatch between the rear-contact solar cell 100 and other layers of the rear-contact solar cell assembly such as the conductive foils 110 and 130 and the insulator layer 120. In addition, a low melting or curing temperature, low elastic modulus, and a low glass-transition temperature are generally desirable for the electrical connections 142 and 144 in order to minimize the CTE mismatch stress generated during contact formation and subsequent thermal cycling. In some embodiments, a reduction in the level of CTE-mismatch-induced shear stress on the first and second electrical connections 142 and 144 is achieved by embossing or intentionally deforming the conductive foils 110, 130 and/or the insulator layer 120 during the manufacture of the rear-contact solar cell assembly. Embossing may have the effect of creating free volume in or near the conductive foils 110 and 130 and/or the insulator layer 120, thereby allowing these materials to expand and contract more freely during thermal cycling without generating large shear stresses on the electrical connections 142 and 144. Furthermore, although the rear-contact solar cell assembly shown in FIG. 1 depicts holes in the first conductive foil 110 and the insulator layer 120 only where the second electrical connections 144 are located, in some embodiments it may be advantageous to create additional holes through the first conductive foil 110, the insulator layer 120, and/or the second conductive foil 130 in locations not directly overlapping the first or second electrical connections 142 and 144. These additional holes may help create free volume and provide a degree of in-plane stress relief to the conductive foils 110 and 130 and the insulator layer 120. This may help reduce the level of shear stress on the first and second electrical connections 142 and 144 during thermal cycling or other extreme temperature conditions encountered during lamination or outdoor exposure.

In some embodiments, a third adhesive material 140 may be used to improve the mechanical adhesion between the rear-contact solar cell 100 and the first conductive foil 110. Because the first and second electrical connections 142 and 144 have limited surface area relative to the area of the rear-contact solar cell 100, the electrical connections 142 and 144 alone may not provide sufficient adhesion to withstand module lamination and/or long-term outdoor exposure. The third adhesive material 140 is thus used in some embodiments to improve the adhesion between the rear-contact solar cell 100 and the first conductive foil 110. The third adhesive material 140 may also help to limit the shear stress that develops on the first and second electrical connections 142 and 144 during thermal cycling and outdoor exposure by constraining relative motion between the rear-contact solar cell 100 and the first and second conductive foils 110 and 130 as well as other materials in the rear-contact solar cell assembly. The third adhesive layer 140 may include one or more of the following: a hot melt adhesive, pressure sensitive adhesive, B-stage adhesive, thermoset adhesive, thermoplastic adhesive, cross-linking adhesive, or some other adhesive type. If the curing mechanism of the third adhesive layer 140 is of a thermoset and/or cross-linking nature, it may be preferable for the third adhesive layer 140 to have a long shelf life to minimize the degree of curing that takes place between the fabrication of the foil components and the placement of the rear-contact PV cells during module assembly.

The third adhesive material 140 may also be used provide electrical insulation between the rear-contact solar cell 100 and the first conductive foil 110. A third adhesive material 140 with insulating properties may be useful in cases in which metal lines of both positive and negative polarity are routed across the rear face of a rear-contact solar cell (not shown in FIG. 1). In this case, an insulating third adhesive layer 140 may help prevent electrical shorts between the first conductive foil 110 and metal traces of the opposite polarity on the rear face of the rear-contact solar cell 100. If the third adhesive material 100 does not provide sufficient electrical insulation, a patterned dielectric insulation layer may be disposed between the first conductive foil 110 and the third adhesive material 140 or between the third adhesive material 140 and the rear-contact solar cell 100 to provide the necessary isolation.

Various solar module lamination materials and techniques may be used to provide additional mechanical integrity and environmental protection to the rear-contact solar cell assembly. For example, an adhesive such as EVA, polyurethane, polyolefin, ionomer, polyethylene, or silicone and a front glass sheet such as tempered glass, low-iron glass, or annealed glass may be used to protect the front surface of the assembly from environmental or mechanical damage. In some embodiments, a backsheet material or layer stack is used to protect the rear surface of the second conductive foil 130. For example, a backsheet laminate comprising Tedlar®, PET, and EVA (also known as TPE, commercially available from Madico Corporation, Woburn, Mass., for example) may be suitable for application to the rear surface of the second conductive foil 130. In various embodiments, any material that can be used in the final module lamination of conventional front-contact solar cells may also be used in the lamination of the rear-contact solar cell assembly.

In some embodiments, it may be preferable to simultaneously cure the electrical connections 142 and 144, the third adhesive material 140, the adhesive used to attach the front glass sheet to the rear-contact solar cell assembly, and the adhesive used to attach the backsheet to the rear-contact solar cell assembly in a single curing step. Once the front glass sheet and the rear-contact solar cell assembly have been mechanically coupled to each other, the front glass sheet may have enough thickness and stiffness to reduce CTE-mismatch-induced bending or warping of the rear-contact solar cell 100 as the electrical connections and adhesive materials are cured. This may help reduce or prevent breakage of the cell 100.

In embodiments in which the electrical connections 142 and 144 must be cured (or reflowed) at a higher temperature than adhesive layers such as the third adhesive 140, the adhesive used to attach the front glass sheet to the rear-contact solar cell assembly, and/or the adhesive used to attach the backsheet to the rear-contact solar cell assembly, it may be advantageous to cure or reflow the electrical connections 142 and 144 only after the adhesive layers have first been cured. This may help ensure that the rear-contact solar cell 100 remains mechanically supported during the curing of the electrical connections 142 and 144 and may help prevent the cell 100 from warping or breaking Techniques which may be used to provide localized heat to cure or reflow the electrical connections 142 and 144 include, but are not limited to, laser heating, inductive soldering, ultrasonic soldering, and hot bar/point soldering.

An advantage of the rear-contact solar cell assembly exemplified in FIG. 1 is that large area rear-contact solar cells 100 may be incorporated into the assembly with low electrical losses. For example, as the length and width of the rear-contact solar cell 100 increases from 125 mm to 156 mm to 210 mm, the thickness of the conductive foils 110 and 130 may be increased from about 25 microns to about 100 microns to offset $I^2R$ losses arising from the longer current path across the foil and the overall increase in cell current. For a fixed conductor layer thickness and composition, prior art front-contact solar cells tend to suffer from a much larger $I^2R$ loss than the rear-contact solar cell assembly. This is because the front conductor layers in prior art front-contact solar cells typically occupy a much smaller percentage of the solar cell surface area than the conductive foils 110 and 130.

In the example shown in FIG. 1, the fact that the conductive foils 110 and 130 each carry current in separate planes (or layers) of the rear-contact solar cell assembly may also provide an advantage over prior art interdigitated back contact solar cells and modules. In cases in which the second polarity contacts 104 of the assembly comprise a localized array of points or dots, it is possible for both the first and second conducting foils 110 and 130 to occupy a large fraction of the surface area of the rear-contact solar cell. For a fixed conductor thickness and composition, this generally gives the first and second conductive foils 110 and 130 a higher total conductance and lower 12R loss in operation than interdigitated back contact devices in which both conducting materials share the same plane.

The rear-contact solar cell assembly is thought to be particularly advantageous in the interconnection of relatively thin mono- or multi-crystalline silicon solar cells. For example, as the cell thickness is reduced from about 200 microns to approximately 150 microns, 100 microns, or even 50 microns, the first and second electrical connections 142 and 144, the third adhesive layer 140, and a front glass cover sheet may provide mechanical support and help distribute CTE mismatch and handling-induced stresses across the entire cell during cell interconnection and module lamination. This stands in contrast to conventional front-contact PV cell assembly techniques in which large local stresses and cracks may form during the soldering of thick current-collecting tabs to isolated regions of the cell's front and rear surfaces.

In some embodiments, an assembly of interconnected rear-contact solar cells comprises a first rear-contact solar cell and a second rear-contact solar cell, a first and a third conductive foil with arrays of gaps or holes, a first and second insulating layer with arrays of gaps or holes that at least partially overlap the arrays of gaps or holes in the first and third conductive foils, respectively, and a second and fourth conductive foil. The assembly further comprises a first set of electrical connections made between the first polarity contacts on the rear side of the first rear-contact solar cell and the first conductive foil, and a second set of electrical connections made between the second polarity contacts on the rear side of the first rear-contact solar cell and the second conductive foil, wherein the second set of electrical connections is made through the arrays of gaps or holes in the first conductive foil and the first insulating layer. The assembly further comprises a third set of electrical connections made between the first polarity contacts on the rear side of the second rear-contact solar cell and the third conductive foil, and a fourth set of electrical connections made between the second polarity contacts on the rear side of the second rear-contact solar cell and the fourth conductive foil, wherein the fourth set of electrical connections is made through the arrays of gaps or holes in the third conductive foil and the second insulator material. The second conductive foil and third conductive foil are electrically connected to establish the interconnection between the rear-contact solar cells.

Figure 2:
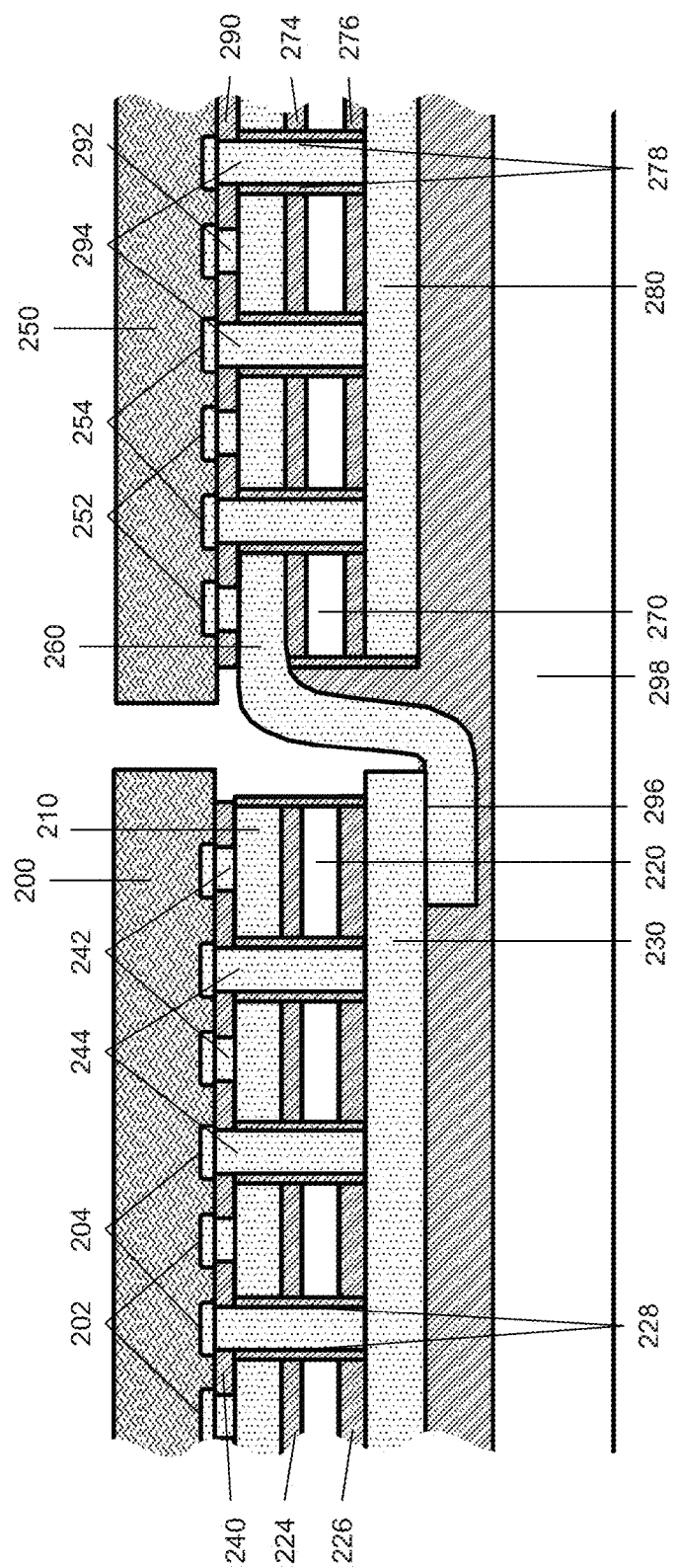
FIG. 2 is a diagram illustrating an example of an assembly of interconnected rear-contact solar cells.

FIG. 2 is a diagram illustrating an example of an assembly of interconnected rear-contact solar cells. The assembly comprises a first rear-contact solar cell 200 including first and second polarity contacts 202 and 204, a first conductive foil 210, a first insulating layer 220, and a second conductive foil 230. It further comprises a second rear-contact solar cell 250 including first and second polarity contacts 252 and 254, respectively, a third conductive foil 260, a second insulating layer 270, and a fourth conductive foil 280. First and second electrical connections 242 and 244 provide an electrically conductive pathway between the first and second polarity contacts 202 and 204 of the first rear-contact solar cell 200 and the first and second conductive foils 210 and 230, respectively. Similarly, third and fourth electrical connections 292 and 294 provide an electrically conductive pathway between the first and second polarity contacts 252 and 254 of the second rear-contact solar cell 250 and the third and fourth conductive foils 260 and 280, respectively. The second electrical connections 244 extend through gaps or holes in the first conductive foil 210 and the first insulating layer 220, while the fourth electrical connections 294 extend through gaps or holes in the third conductive foil 260 and second insulating layer 270.

First and second adhesive layers 224 and 226 attach the first insulating layer 220 to the first and second conductive foils 210 and 230, respectively. Similarly, fourth and fifth adhesive layers 274 and 276 attach the second insulating layer 270 to the third and fourth conductive foils 260 and 280, respectively. The first and second insulator sidewall coatings 228 and 278 coat and electrically isolate the edges of the gaps or holes in the first and third conductive foils 210 and 260, respectively. In some embodiments, the first and second insulator sidewall coatings 228 and 278 are optional and a clearance is used to at least partially electrically isolate the edges of the gaps or holes in the first and third conductive foils 210 and 260. For example, a critical feature size of the second electrical connections 244 may be 25-50% smaller than a width of the gaps or holes in the first conductive foil 210. This may enable the second electrical connections 244 to pass through the first conductive foil 210 with a clearance between the two, thereby improving the electrical isolation.

Various examples of dimensions and configurations have been described earlier in the specification in relation to the dimensions of electrical connections, gaps or holes in the first conductive foil and the insulator sidewall coatings in FIG. 1 that apply in some embodiments to FIG. 2. In some embodiments, third and sixth adhesive layers 240 and 290 attach the first and second rear-contact cells 200 and 250 to the first and third conductive foils 210 and 260, respectively. A backsheet 298 may provide mechanical support to the assembly of interconnected rear-contact solar cells. In some embodiments, other components such as an encapsulant-covered front glass cover sheet (not shown in FIG. 2) may be used to provide mechanical support and environmental protection to the assembly.

A series connection between the rear-contact solar cells 200 and 250 may be established by electrically connecting the second conductive foil 230 and the third conductive foil 260 to each other using a foil interconnection 296. Examples of materials that may be used to form the foil interconnection 296 include, but are not limited to: solders, conductive inks, isotropic electrically conductive adhesives (ECAs), anisotropic electrically conductive adhesives, bulk metallic conductors, and conducting clamps. In some embodiments, the second conductive foil 230 and the third conductive foil 260 may be directly welded together. The foil interconnection 296 completes a low-resistance pathway from the second polarity contacts 204 of the first rear-contact solar cell 200 to the first polarity contacts 252 of the second rear-contact solar cell 250. The low-resistance pathway runs through the second electrical connections 244, the second conductive foil 230, the foil interconnection 296, the third conductive foil 260, and the third electrical connections 292.

In the embodiment shown in FIG. 2, the conductive foils 210, 230, 260 and 280 are used solely as interconnection materials and do not act as a substrate for the active solar cell. This allows the conductive foil beneath one solar cell (e.g., the third conductive foil 260 in FIG. 2) to be electrically connected to the conductive foil beneath an adjacent solar cell (e.g., the second conductive foil 230 in FIG. 2) by extending and wrapping the exposed edge of the third conductive foil 260 underneath the second conductive foil 230 and establishing electrical contact through the foil interconnection 296. This allows the contact area between the two conductive foils 260 and 230 to be maximized without the need for removing portions of the active solar cell material or reducing the coverage of the conductive foils 210, 230, 260 and 280 beneath each solar cell.

In some embodiments, the conductive foils 210, 230, 260 and 280 and the rear-contact solar cells 200 and 250 are each discrete components in the assembly and their discrete nature provides advantages when the active solar cell material is fragile or has a tendency to break. For example, the conductive foils 210, 230, 260 and 280, the insulating layers 220 and 270, and other passive components of the assembly may all be assembled using roll-to-roll process techniques and then subsequently attached to the rear-contact solar cells 200 and 250 just prior to final lamination. This may help prevent breakage of the rear-contact solar cells 200 and 250 by minimizing handling and/or reducing the level of mechanical stress placed on the rear-contact solar cells during fabrication.

In some embodiments, an assembly of interconnected rear-contact solar cells comprises a first rear-contact solar cell and a second rear-contact solar cell, a first and a second conductive foil with arrays of gaps or holes, a first and second insulating layer with arrays of gaps or holes that at least partially overlap the arrays of gaps or holes in the first and second conductive foils, respectively, and a third conductive foil. The assembly further comprises a first set of electrical connections made between the first polarity contacts on the rear side of the first rear-contact solar cell and the first conductive foil, and a second set of electrical connections made between the second polarity contacts on the rear side of the first rear-contact solar cell and the second conductive foil, wherein the second set of electrical connections is made through the arrays of gaps or holes in the first conductive foil and the first insulating layer. The assembly further comprises a third set of electrical connections made between the first polarity contacts on the rear side of the second rear-contact solar cell and the second conductive foil, and a fourth set of electrical connections made between the second polarity contacts on the rear side of the second rear-contact solar cell and the third conductive foil, wherein the fourth set of electrical connections is made through the arrays of gaps or holes in the second conductive foil and the second insulating material.

Figure 3:
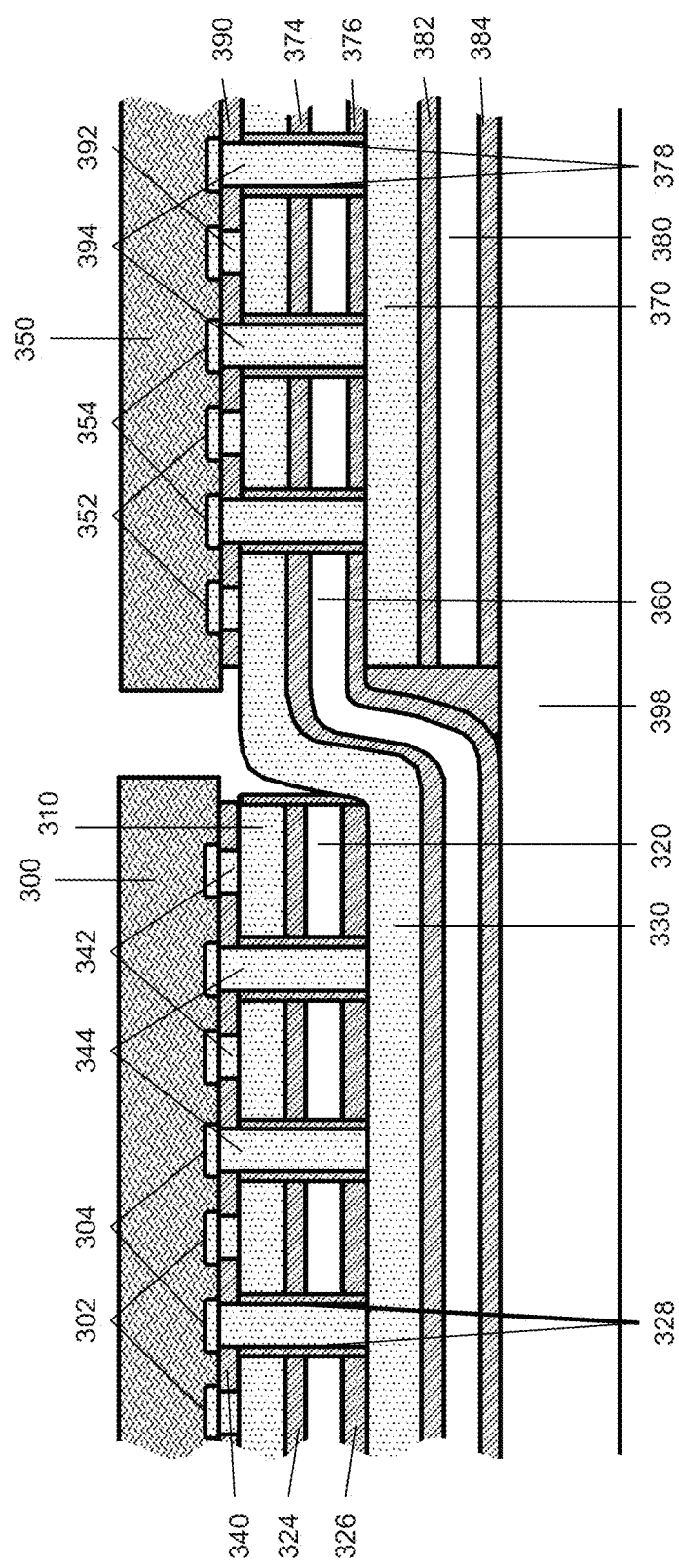
FIG. 3 is a diagram illustrating an example of an assembly of interconnected rear-contact solar cells.

FIG. 3 is a diagram illustrating an example of an assembly of interconnected rear-contact solar cells. The assembly comprises a first rear-contact solar cell 300 including first and second polarity contacts 302 and 304, a first conductive foil 310, a first insulating layer 320, and a second conductive foil 330. It further comprises a second rear-contact solar cell 350 including first and second polarity contacts 352 and 354, a second insulating layer 360, a third conductive foil 370, and a third insulating layer 380. First and second electrical connections 342 and 344 provide an electrically conductive pathway between the first and second polarity contacts 302 and 304 of the first rear-contact cell 300 and the first and second conductive foils 310 and 330, respectively. The third and fourth electrical connections 392 and 394 provide an electrically conductive pathway between the first and second polarity contacts 352 and 354 of the second rear-contact solar cell 350 and the second and third conductive foils 330 and 370, respectively. The second electrical connections 344 extend through gaps or holes in the first conductive foil 310 and the first insulating layer 320, while the fourth electrical connections 394 extend through gaps or holes in the second conductive foil 330 and the second insulating layer 360.

First and second adhesive layers 324 and 326 attach the first insulating layer 320 to the first and second conductive foils 310 and 330, respectively. Similarly, fourth and fifth adhesive layers 374 and 376 attach the second insulating layer 360 to the second and third conductive foils 330 and 370, respectively. A seventh adhesive layer 382 attaches the third insulating layer 380 to the third conductive foil 370. In some embodiments, second, fifth, and eighth adhesive layers 326, 376 and 384, respectively, may also provide adhesion to backsheet 398 in some regions of the assembly. The first and second insulator sidewall coatings 328 and 378 coat and electrically isolate the edges of the gaps or holes in the first and second conductive foils 310 and 330, respectively. In some embodiments, the first and second insulator sidewall coatings 328 and 378 are optional and a clearance is used to at least partially electrically isolate the edges of the gaps or holes in the first and second conductive foils 310 and 330 from the second and fourth electrical connections 344 and 394, respectively.

Various examples of dimensions and configurations have been described earlier in the specification in relation to the dimensions of electrical connections, gaps or holes in the conductive foil and the insulator sidewall coatings in FIG. 1 that apply in some embodiments to FIG. 3. In some embodiments, third and sixth adhesive layers 340 and 390 attach the first and second rear-contact silicon cells 300 and 350 to the first and second conductive foils 310 and 330, respectively. A backsheet 398 provides mechanical support to the assembly. In some embodiments, other components such as an encapsulant-covered front glass cover sheet (not shown in FIG. 3) may be used to provide mechanical support and environmental protection to the assembly.

Although the second, fifth, and eighth adhesive layers 326, 376 and 384 are depicted in FIG. 3 as being disposed beneath the first, second, and third insulator layers 320, 360 and 380, respectively, in another embodiment the adhesive layers 326, 376 and 384 are applied to at least a portion of the top surface of the conductive foils 310, 330 and 370 using a printing or lamination technique. In this case, it may be desirable to pattern openings in the adhesive layers 326, 376 and 384 that at least partially overlap the gaps or holes in the conductive foils 310, 330 and 370 and insulator layers 320, 360 and 380, respectively. These openings allow the second and fourth electrical connections 344 and 394 to be made to conductive foils 330 and 370, respectively, for example.

In some embodiments, if the adhesive layers 326, 376 are 384 are applied to the top surface of each of the conductive foils 310, 330 and 370, and if additional openings in the adhesive layers 326, 376 are 384 are made where the first, second, third, and fourth electrical connections 342, 344, 392 are 394 are present, it may be possible for the adhesive layers 326, 376 and 384 to both attach the conductive foil to an adjacent insulator layer over roughly one-half of the conductive foil surface, and to attach the conductive foil to an adjacent rear-contact solar cell over the other roughly one-half of the foil surface. For example, in an embodiment in which the fifth adhesive layer 376 is applied to the top surface of the second conductive foil 330 instead of on the bottom surface of the second insulator layer 360, the fifth adhesive layer 376 may be used to attach roughly one half of the conductive foil 330 to the first insulator layer 320 and attach the other half (or remaining portion) of the conductive foil 330 to the second rear-contact solar cell 350. In this case, the fifth adhesive layer 376 effectively eliminates the need for the sixth adhesive layer 390. Similarly, conductive foils 310 and 370 may be coated with a single adhesive layer that facilitates adhesion with adjacent insulator layers over roughly one half of the conductive foil surface and with rear-contact solar cells over the other roughly one half of the conductive foil surface. In this configuration it may be preferable for the adhesive layers 326, 376 and 384 to comprise a thermoplastic "hot melt" adhesive, a pressure sensitive adhesive, a two-stage (or "B-stage") adhesive, or a cross-linkable adhesive.

In the embodiment shown in FIG. 3, the second conductive foil 330 makes direct contact with both the second electrical connections 344 corresponding to the second polarity contacts 304 of the first rear-contact solar cell 300 and the third electrical connections 392 corresponding to the first polarity contacts 352 of the second rear-contact solar cell 350. The use of a single, continuous sheet of conductive foil to complete the series connection between two adjacent rear-contact cells 300 and 350 eliminates the need to interconnect separate conductive foils between each rear-contact solar cell. As a consequence, the electrical resistance of the pathway from the second polarity contacts 304 of the first rear-contact solar cell 300 to the first polarity contacts 352 of the second rear-contact solar cell 350 may be decreased. In addition, the use of a single sheet of conductive foil 330 to make the series connection may simplify manufacturing of the assembly of interconnected rear-contact solar cells, as described below.

FIGS. 4A-4I are sequential cross-sectional schematic diagrams illustrating examples of the fabrication of an assembly of interconnected rear-contact solar cells. A starting substrate 400 shown in FIG. 4A comprises a conductive foil laminated or bonded to an insulating layer. Optionally, an adhesive layer may be used to improve the adhesive bond between the conductive foil and the insulating layer. In some embodiments the insulating layer may be directly deposited on the conductive foil and/or adhesive layer, while in other embodiments the insulating layer comprises a sheet material that is subsequently attached to the conductive foil and/or adhesive layer. In some embodiments, the starting substrate 400 comprises a pre-assembled laminate of aluminum foil and PET bonded together by an adhesive layer. The starting substrate 400 is approximately twice the length of the rear-contact solar cell in one dimension and is approximately equal to the width of the rear-contact solar cell in a second dimension. For example, if the rear-contact solar cell dimensions are 156 mm×156 mm, the starting substrate 400 should be roughly 156 mm×312 mm, although a tolerance of +/−20% may be acceptable or in some cases even beneficial. For example, at least a portion of the starting substrate 400 may be made narrower than the width of the rear-contact solar cell to help prevent cell-substrate or substrate-substrate shunting at the substrate edges. The thickness of the starting substrate 400 may range from a few microns to a millimeter depending on its desired conductance and insulating properties.

Figure 4A:
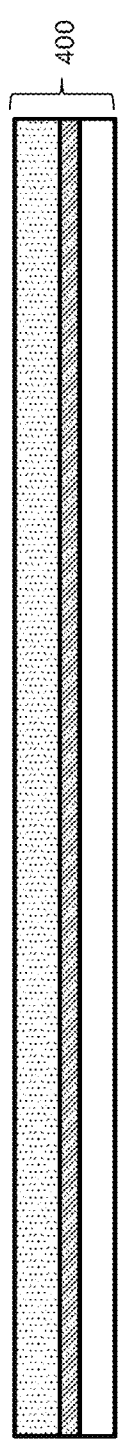
Figure 4B:
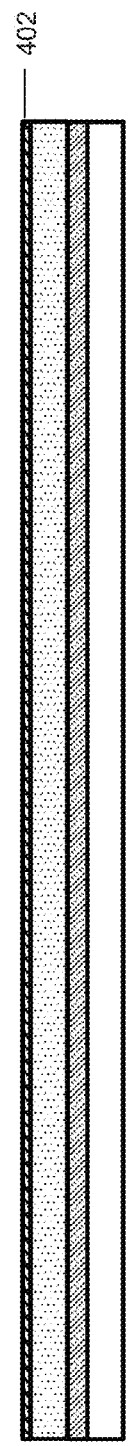

In some embodiments, the top surface of the conductive foil in the starting substrate 400 is coated or plated with a surface finish 402 to make the surface solderable and/or stable against oxidation, as shown in FIG. 4B. Electroplating, sputtering, or other deposition techniques may be used to deposit the surface finish 402. The thickness of the surface finish may range from a few nanometers to several microns.

Figure 4C:
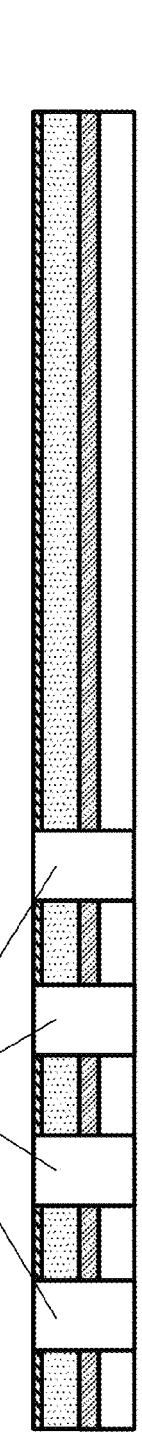

In FIG. 4C, an array of gaps or holes 404 is cut in the starting substrate 400. While FIG. 4C depicts the gaps or holes 404 being formed in the starting substrate 400 in a single step, in other embodiments, the gaps or holes 404 are cut into the conductive foil and the insulator layer separately. The gaps or holes 404 provide an opening in the conductive foil and insulator layer to allow current to be passed from the second polarity contact of the rear-contact solar cell to an underlying sheet of conductive foil. In various embodiments, the gaps or holes 404 are patterned to match the pattern of the second polarity contacts in the rear-contact solar cell. In addition, it may be preferable to enlarge the gaps or holes 404 slightly relative to the size of the second polarity contacts in the rear-contact solar cell in order to prevent electrical shorts between the first conductive foil and the second polarity contact. A wide variety of techniques may be used to form the pattern of gaps or holes 404, including but not limited to mechanical punching, rotary die punching, laser cutting, laser drilling, or photolithographic patterning and etching. In some embodiments, the pattern of second polarity contacts on the rear-contact solar cell comprises an array of localized points or dots on the rear surface of the cell. In this case, it may be advantageous to form circular gaps or holes 404 in the starting substrate 400. The diameter or critical feature size of the gaps or holes 404 may range from tens of microns to tens of millimeters depending on the pattern and size of the second polarity contacts. The ability to form small diameter gaps or holes 404 in the starting substrate 400 may be advantageous for interconnecting rear-contact solar cells that have a high density of contacts on the rear surface of the cell. For example, the ability to form small diameter gaps or holes is well-suited for interconnecting rear-point-contact solar cells and emitter wrap-through solar cells, which typically have a contact pitch on the order of 2-20 mm.

Figure 4D:
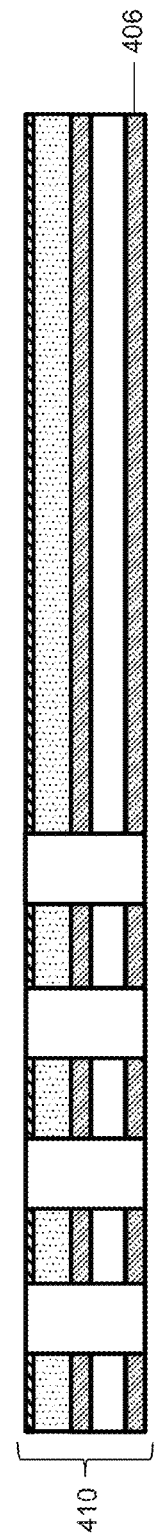

A second adhesive layer 406 is coated or laminated in sheet form on the lower surface of the starting substrate 400 in FIG. 4D. Methods by which the second adhesive layer 406 may be applied include, but are not limited to, screen printing, gravure printing, slot coating, inkjet printing, doctor blade coating, roller coating, and spray coating. In some embodiments, the rheology of the second adhesive layer 406 and the technique used to deposit the layer are adjusted to allow the second adhesive layer 406 to coat the edges of the gaps or holes 404 in the starting substrate 400. This may provide a degree of electrical isolation at the edges of the holes and prevent electrical shorts from forming during subsequent process steps.

Alternatively, the coated or laminated second adhesive layer 406 may be applied to at least a portion of the upper surface of the starting substrate 400. As described previously, this may have the benefit of reducing the overall number of layers and process steps required to make the assembly of interconnected rear-contact solar cells. In some embodiments, it may be preferable to apply the second adhesive layer 406 before gaps or holes 404 have been made in the starting substrate 400. This may help improve the alignment between the gaps or holes in the starting substrate 400 and the gaps or holes in the second adhesive layer 406.

Figure 4E:
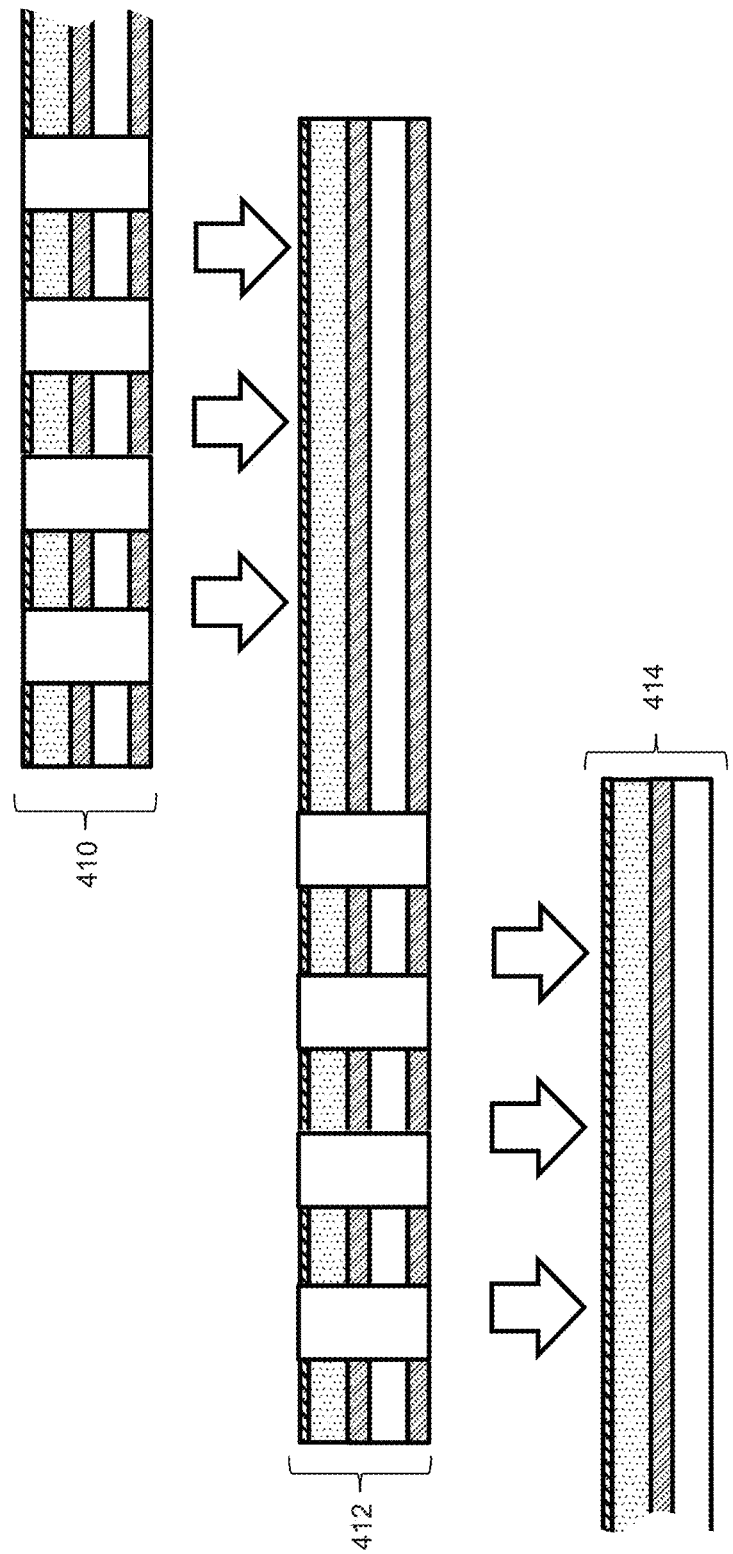

In FIG. 4E, final substrates 410, 412 and 414, each comprising plated, patterned, and adhesive-coated conductive foil/insulating layer laminates, are laminated together in a partially overlapping pattern. The final substrates 410, 412 and 414 are laminated such that roughly one half of each final substrate 410, 412 and 414 is overlapped with an adjacent final substrate. The exact degree of overlap may be adjusted based on other system requirements, such as the desired spacing of the rear-contact cells and the avoidance of shunt formation at the foil edges.

Although the final substrates 410, 412, 414 are shown in FIGS. 4A-4E to have been singulated at the beginning of the manufacturing process, in some embodiments the substrates are singulated from a base roll of material after the steps shown in FIGS. 4B-4D and just prior to the lamination step shown in FIG. 4E. This may simplify the manufacturing process by enabling the steps in FIGS. 4B-4D to be performed while the conductive foil/insulating layer laminate is in continuous sheet form. In some embodiments, the plated, patterned, and adhesive-coated conductive foil/insulating layer laminates are stored in rolls until just prior to the lamination step shown in FIG. 4E.

In FIG. 4F, a backsheet 416 is laminated to the partially overlapping final substrates 410, 412 and 414. The backsheet 416 may comprise glass, Tedlar®, TPE, Tedlar®/Polyester/Tedlar® (TPT), or other suitable materials. In some embodiments, the backsheet 416 may be primed with an additional adhesive material to promote adhesion to the final substrates 410, 412 and 414. Although FIG. 4F depicts the attachment of the final substrates 410, 412 and 414 to the backsheet 416 prior to attachment of the rear-contact solar cells, in some embodiments the final substrates 410, 412 and 414 are first attached to the rear-contact solar cells and then subsequently laminated to the backsheet 416.

Figure 4G:
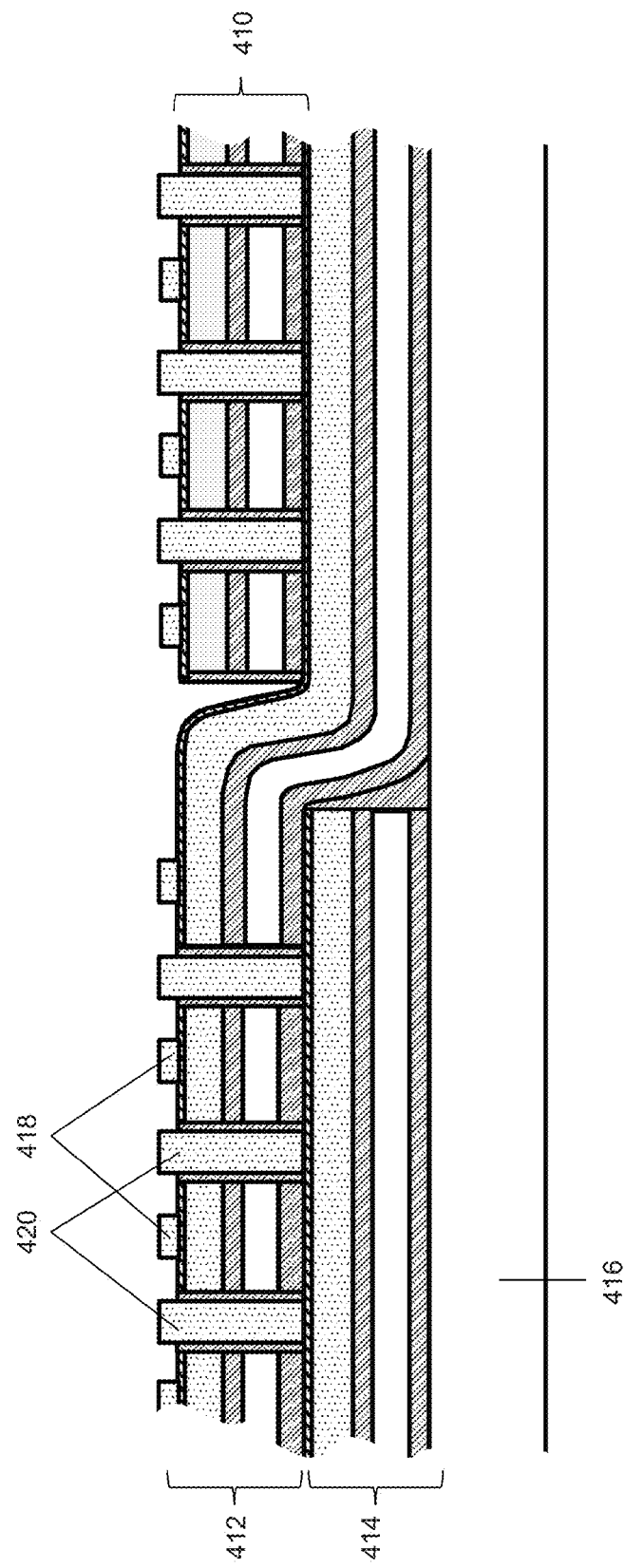

Next, first and second electrical connections 418 and 420 are made to the conductive foil surface as shown in FIG. 4G. A wide variety of techniques may be used to apply the electrical connections 418 and 420, including but not limited to screen printing, stencil printing, inkjet printing, dispensing, or electroplating. Although the required thicknesses of the first and second electrical connections 418 and 420 are different as shown in FIG. 4G, in various embodiments, it is desirable to use a single process step to form the first and second electrical connections 418 and 420. In some embodiments, stencil printing, dispensing, or screen printing may be used to make the first and second electrical connections 418 and 420 in a single process step.

Figure 4H:
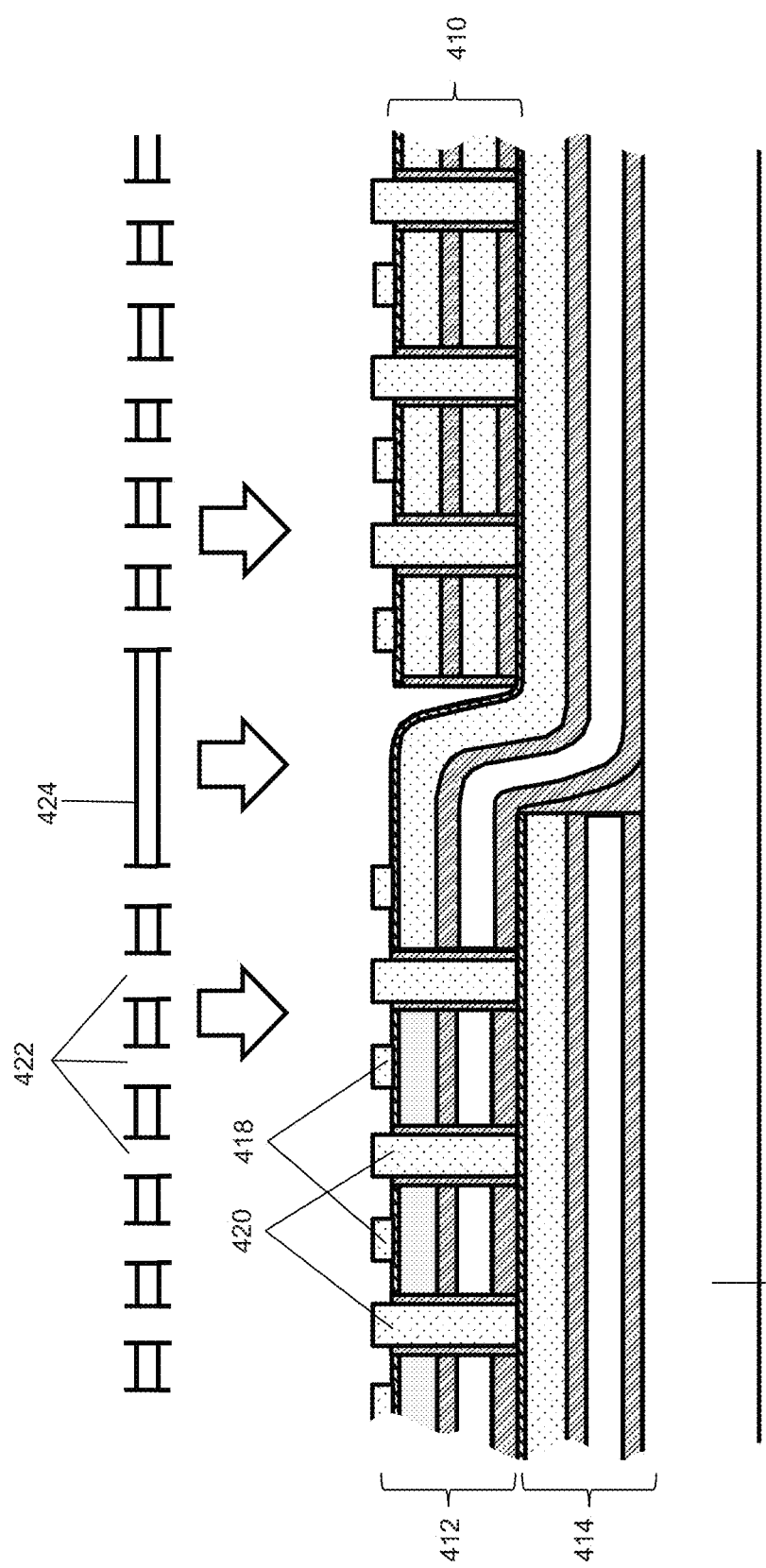

In FIG. 4H, third adhesive layer 424 is applied to the top surface of the final substrates 410, 412 and 414 in regions where the electrical connections 418 and 420 are not present. If the third adhesive layer 424 is in sheet form, in some embodiments the layer may be patterned with gaps or holes 422 before application. Techniques including but not limited to mechanical punching, rotary die punching, laser cutting, laser drilling, or photolithographic patterning and etching may be used to pattern the third adhesive layer 424 (e.g., an apparatus available from Eurotron BV of the Netherlands may be used to mechanically pattern an adhesive sheet with gaps or holes).

In other embodiments, the third adhesive layer 424 is applied in wet form from a solution or melt. Screen printing, gravure coating, slot coating, inkjet printing, or spray coating may be used to apply the third adhesive layer 424 in regions where the electrical connections 418 and 420 are not present. The third adhesive material 424 may comprise a hot melt adhesive, pressure sensitive adhesive, B-stage adhesive, thermoset adhesive, thermoplastic adhesive, cross-linking adhesive, and/or another type of adhesive. If the curing mechanism of the third adhesive layer 424 is of a thermoset and/or cross-linking nature, it may be preferable for the third adhesive layer 424 to have a long shelf life to minimize the degree of curing that takes place between the fabrication of the foil components and the placement of the rear-contact PV cells during module assembly.

Although FIGS. 4G and 4H illustrate the application of the third adhesive layer 424 after the electrical connections 418 and 420 have been applied to the final substrates 410, 412 and 414, in other embodiments the third adhesive layer 424 is applied before formation of the electrical connections 418 and 420. This process sequence may have the advantage of preventing electrical shorts between the second electrical connections 420 and the final substrates 410, 412 and 414 if there is a registration error between the arrays of the second electrical connections 420 and the gaps or holes 404 in the final substrates 410, 412 and 414.

Figure 4I:
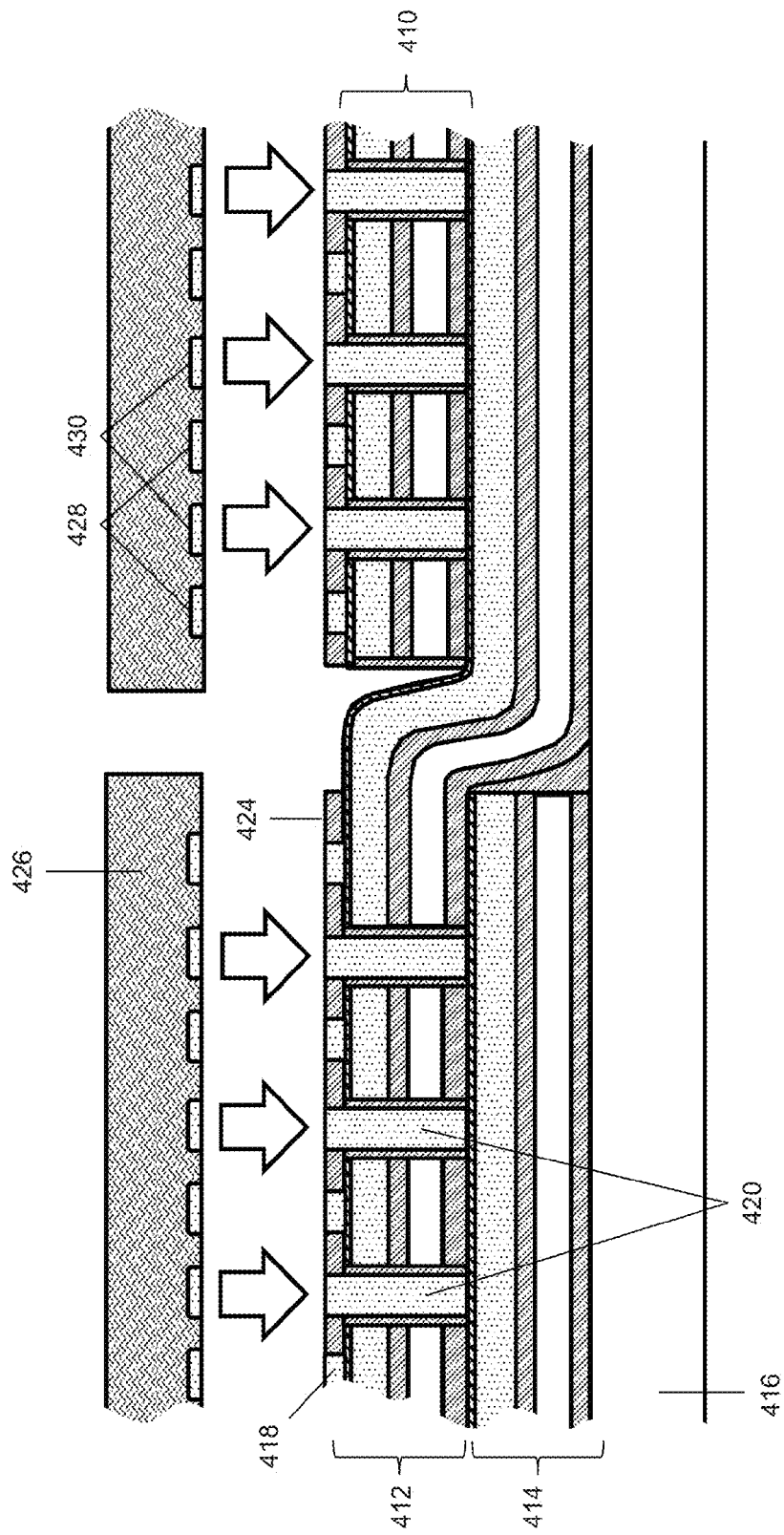

Rear-contact solar cells 426 with first and second polarity contacts 428 and 430 are subsequently applied to the first and second electrical connections 418 and 420 and the third adhesive layer 424 as shown in FIG. 4I. The positioning of the rear-contact solar cells must be sufficiently accurate to allow the first and second polarity contacts 428 and 430 to be connected to the first and second electrical connections 418 and 420, respectively, with high yield. This step may be carried out using commercially available pick-and-place robots, for example. Once the rear-contact solar cells 426 have been applied, the assembly may then be laminated to a front glass cover sheet using conventional means.

By waiting until near the end of the manufacturing process to attach the rear-contact solar cells 426 to the rest of the layer stack, it may be possible to minimize breakage of the cells due to handling and thermally-induced stresses. To this end, after the cells have been placed on the layer stack, it may be advantageous to apply heat to cure the electrical connections 418 and 420 and the third adhesive layer 424 only after the encapsulant-covered front glass cover sheet has also been applied to the other layers. The presence of the front glass cover sheet may help prevent warpage and breakage of the rear-contact cells during curing of the other layers. This may improve module yield, particularly when the thickness of the cells is below 200 microns.

Although the process steps shown in FIGS. 4G-4I depict the application of the electrical connections 418 and 420 and the third adhesive layer 424 to the surfaces of the final substrates 410, 412 and 414, in some embodiments it may be advantageous to first apply one or both of these layers to the surfaces of the rear-contact solar cells 426. For example, it may simplify and/or improve the accuracy of the alignment of the rear-contact solar cells 426 with the electrical connections 418 and 420 and/or the third adhesive layer 424 if these materials are directly applied to the rear-contact solar cells 426.

In addition, although the process steps shown in FIGS. 4F-4I depict lamination of the backsheet 416 to the final substrates 410, 412 and 414 before the application of the electrical connections 418 and 420, the third insulator layer 424, and the rear-contact solar cells 426, in some embodiments it may be preferable to instead apply the backsheet 416 just before the final lamination of the PV module. For example, it may be preferable to first form strings of interconnected rear-contact solar cells by attaching the rear-contact solar cells 426 to the electrical connections 418 and 420, the third adhesive layer 424, and the final substrates 410, 412 and 414 before these layers have been attached to the backsheet 416. Such a manufacturing flow would show similarities with conventional front-contact solar module production in which strings of interconnected solar cells are first placed face down on an encapsulant-covered front glass cover sheet and are then laminated to the front glass cover sheet and the backsheet in a subsequent process step.

FIGS. 5A-5I are a series of diagrams illustrating examples of the production of a rear-contact PV module.

FIG. 5A is a diagram illustrating an example of a continuous sheet that may be used in the production of a rear-contact PV module. In FIG. 5A, arrays of gaps or holes 504 are periodically patterned in a continuous sheet 500 of a conductive foil/insulating layer laminate 502. The conductive foil/insulating layer laminate may optionally be plated prior to forming the gaps or holes 504.

FIG. 5B is a diagram illustrating an example of an apparatus that may be used in the production of a rear-contact PV module. In the apparatus shown conceptually in FIG. 5B, a roll 510 of the continuous sheet 500 is unwound, an adhesive layer is applied to the top or bottom surface of the sheet (not shown in FIG. 5B), and the sheet is passed through a cutting apparatus 512. The cutting apparatus 512 cuts the continuous sheet 500 into singulated rectangles 514 of the conductive foil/insulating layer laminate 502. The singulated rectangles 514 may be approximately two times the size of the rear-contact solar cells, or may be other sizes depending on the application. Either just before or just after cutting, the singulated rectangles are laid onto the surface of a conveyor 516. As the conveyor 516 moves forward, a nip roller 518 may be used to laminate the singulated rectangles 514 to each other in a partially overlapping pattern. Once a sufficient number of singulated rectangles 514 have been laminated together, the ends of the first and last singulated rectangles may be cut to form an interconnect string 520 as shown in FIG. 5C.

FIG. 5C is a diagram illustrating an example of an interconnect string. The first and last rectangles in the interconnect string 520 may be made slightly larger than the length of a rear-contact solar cell in order to ensure that some exposed conductive foil surface remains for bussing the interconnect strings 520 together following attachment of the rear-contact solar cells.

Several different process sequences may be used to make a finished PV module from one or more interconnect strings 520. In some embodiments, one or more interconnected subassemblies are first made in which rear-contact solar cells are attached to interconnect strings 520. ECAs or other electrical connection materials may be used to make the electrical connections between the rear-contact solar cells and the interconnect strings 520. An additional insulating adhesive layer may optionally be used to provide increased mechanical support in locations where there are no electrical connections. The electrical connections and insulating adhesive layer may either be first applied to the rear-contact solar cells, to the interconnect strings 520, or to a combination of the two.

FIG. 5D is a diagram illustrating an example of an apparatus that may be used to connect rear-contact PV cells to interconnect strings. The apparatus may be used to successively apply electrical connection materials and rear-contact cells 525 to interconnect strings 520 that have been laminated to insulating adhesive layers in a prior step (not shown in FIG. 5D). The insulating adhesive layers may be patterned with openings that at least partially overlap the first and second polarity contacts of the rear-contact cell, as described in other embodiments. A dispense tool 522 may first be used to deposit electrical connection materials such as ECAs or solder pastes on the exposed contact pads of a portion of the interconnect string 520. A conveyor 523 then moves the interconnect string 520 forward in increments to the pick-and-place robot 524, which places the rear-contact cells 525 on the interconnect string 520. The pick-and-place robot may be equipped with a camera and alignment system to improve the placement accuracy of the rear-contact cells 525. The conveyor next carries the string forward to an optional heat zone 526. In cases in which the insulating adhesive material and/or electrical interconnection materials are not sufficiently tacky at room temperature, the heat zone 526 may be used to sufficiently soften/cure the adhesives (either insulating, conductive, or a combination thereof) to form a bond with the rear-contact cells 525. In some embodiments, pressure may be applied to the interconnect string 520 and the rear-contact cells 525 to provide more intimate contact during heating. Once fabricated, the interconnected sub-assembly 528 may then be placed face down on an encapsulant-covered front glass cover sheet (not shown in FIG. 5D) for the attachment of busbars followed by lamination to a backsheet.

In some embodiments, interconnected sub-assemblies are formed by first placing the rear-contact solar cells face down on an encapsulant-covered front glass cover sheet, for example using pick-and-place robots, and then attaching interconnect strings to the exposed rear surface of the rear-contact solar cells. This allows a reduction in handling of the rear-contact solar cells prior to final lamination. As described earlier, ECAs or other materials may be used to make the electrical connections between the rear-contact solar cells and the interconnect string, and an additional insulating adhesive layer may optionally be used to provide increased mechanical support. In some embodiments, mechanical support provided by the encapsulant-covered front glass cover sheet helps protect the rear-contact solar cells from warping or breaking when the interconnect strings 520 are attached.

In various embodiments, it is desirable to achieve good adhesion between the interconnect strings 520 and the rear-contact solar cells without creating large CTE-mismatch-induced stresses and/or strains in the rear-contact solar cells. To this end, it may be advantageous if the insulating adhesive layer becomes tacky or can be at least partially cured at a relatively low temperature (below 120 C, for example). Once the interconnected sub-assemblies have been disposed on the encapsulant-covered front glass cover sheet, conventional front-contact PV module fabrication techniques may be used to bus together adjacent sub-assemblies, laminate the backsheet, and form external electrical connections. Prior to bussing the sub-assemblies together, it may be preferable to fold back the exposed ends of the interconnect strings 520 so that the busbars may effectively be connected behind the rear-contact cells rather than adjacent to them. This approach has the benefit of reducing the inactive area of the front side of the module.

The use of an interconnect string 520 or other linear interconnect (i.e., any interconnect which connects multiple rear-contact solar cells in series in one dimension) may yield several advantages over prior art rear-contact PV module designs in which a large-area interconnect backsheet performs the functions of both (A) interconnecting multiple rear-contact solar cells in two dimensions; and (B) providing mechanical and electrical isolation from the surrounding environment. First, since a linear interconnect may generally be processed in roll form at a width approximately equal to the width of a rear-contact solar cell, relatively narrow width (e.g., <30 cm) process tools may be used to fabricate the interconnect. These tools may possess significant cost and availability benefits over tools designed to process large roll widths and large-area interconnect backsheets. Second, it may be generally much easier to maintain registration accuracy of stacked multiple layers such as metallic contacts, openings, ECA dots, insulator layers, and the like when the roll width is relatively narrow. By contrast, maintaining alignment of these layers can be significantly more difficult in a large area interconnect backsheet, particularly if any of the layers of the backsheet have a tendency to warp or deform during processing. Third, the implementation of an interconnect string as a separate component from the backsheet in a rear-contact PV module may allow a decoupling of the functions of each. Since the purpose of the interconnect string (e.g., providing electrical connections) is substantially different from the purpose of the backsheet (e.g., providing mechanical and electrical isolation from the surrounding environment), separating these two components may, in some embodiments, lead to relaxed material requirements for each, thereby lowering production costs.

Figure 5E:
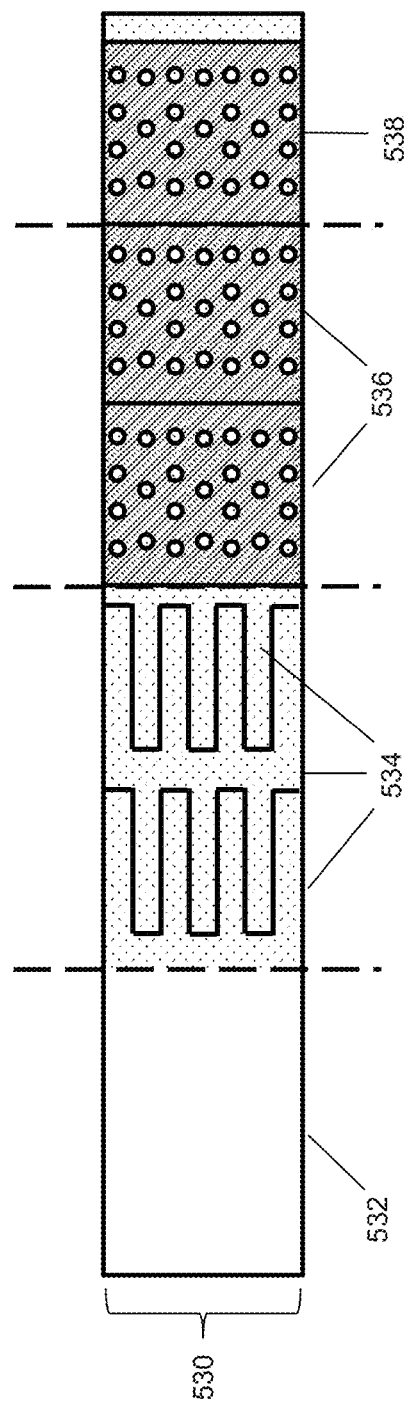
FIG. 5E is a cutaway plan view diagram illustrating an example of an interconnect string.

FIG. 5E is a cutaway plan view diagram illustrating an example of an interconnect string. Interconnect string 530 may be used to interconnect a linear string of rear-contact solar cells. The interconnect string 530 may be used as a component in a rear-contact PV module, and in some embodiments may be disposed between the rear-contact solar cells and a conventional backsheet. An electrically insulating carrier substrate 532 is used to provide mechanical support and electrical isolation. The carrier substrate 532 may comprise a polymer such as PET or polyimide and may be between 10 µm and 150 µm thick. Electrically conducting interdigitated fingers 534, typically comprising a metal such as copper or aluminum and ranging from 10 µm to 200 µm thick, are patterned on the carrier substrate 532. The top surface of the interdigitated fingers 534 may be plated with a surface finish such as silver, nickel, tin, lead, gold, indium, palladium or alloys thereof to provide an environmentally stable electrical contact. Each discrete set of interdigitated fingers 534 electrically connects the positive polarity contacts of a rear-contact PV cell with the negative polarity contacts of an adjacent rear-contact PV cell. Optionally, a dielectric insulation layer 536 may be disposed above the interdigitated fingers 534 with openings patterned in the layer to allow electrical contacts to be made. An adhesive layer 538 is disposed above the optional dielectric insulation layer 536 as well as the interdigitated fingers 534 to provide mechanical adhesion once the interconnect string 530 is attached to the rear-contact solar cells.

Figure 5F:
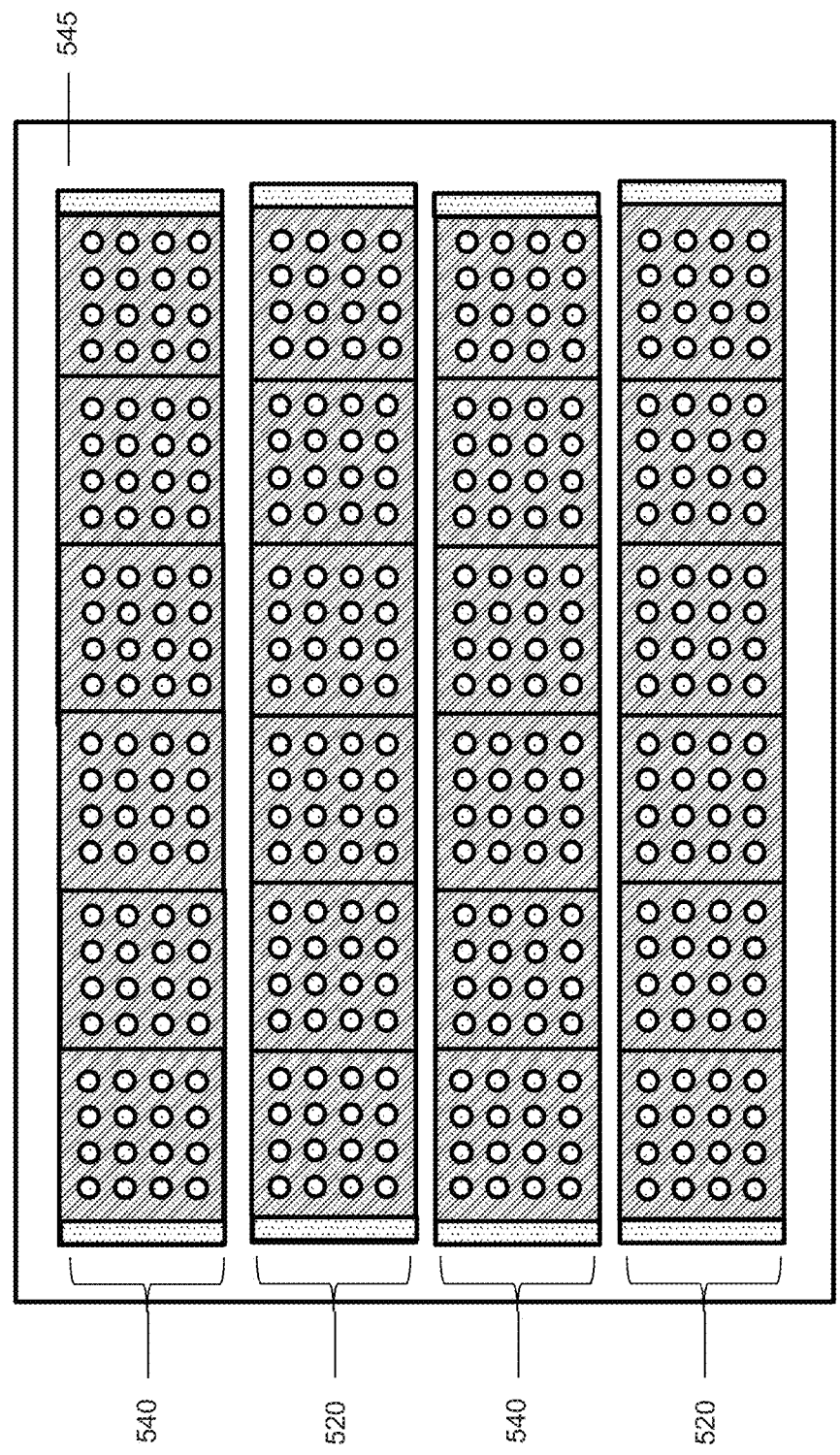
FIGS. 5F-5I are sequential diagrams showing examples of the production of a rear-contact PV module.
Figure 5G:
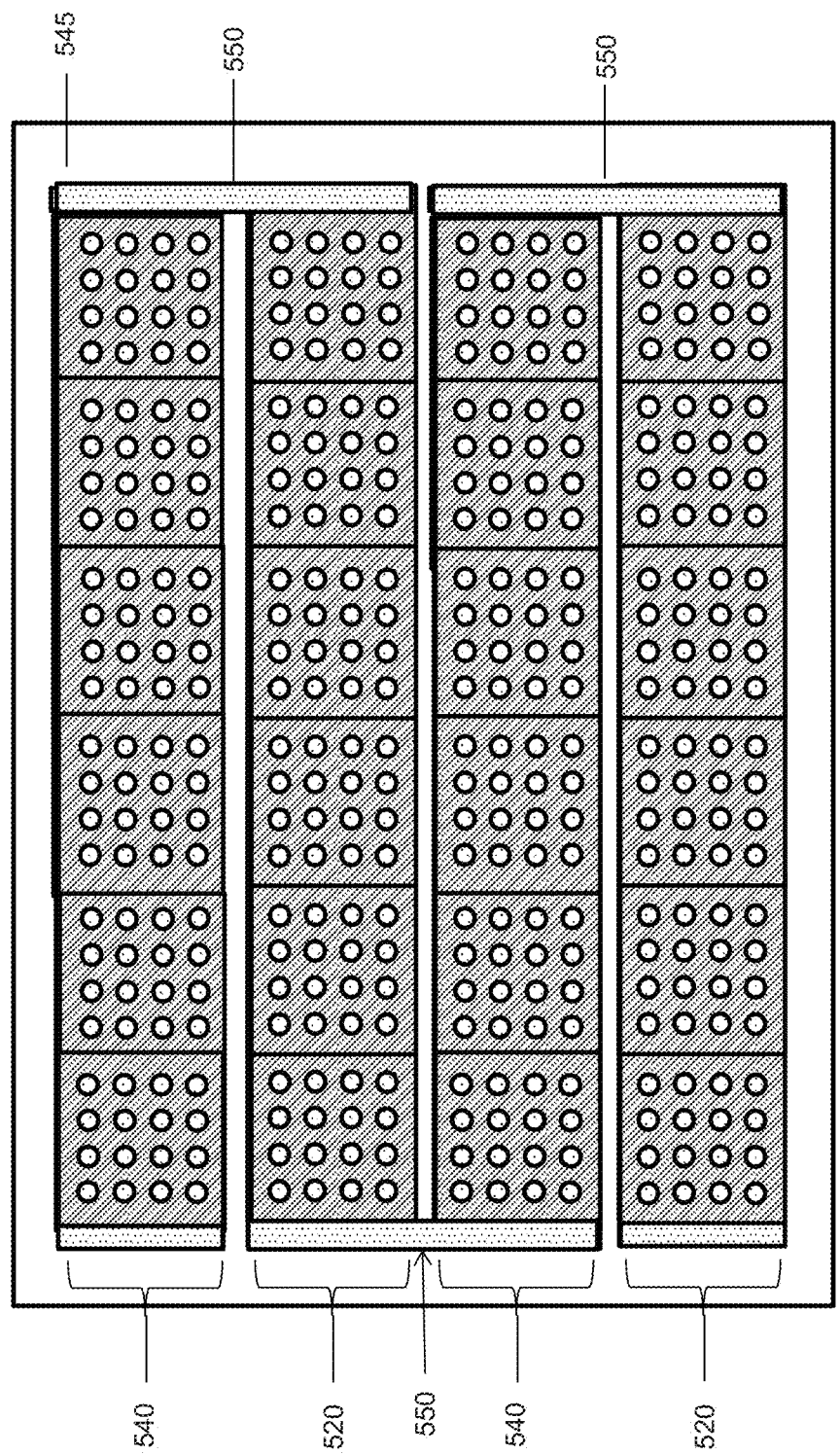
Figure 5H:
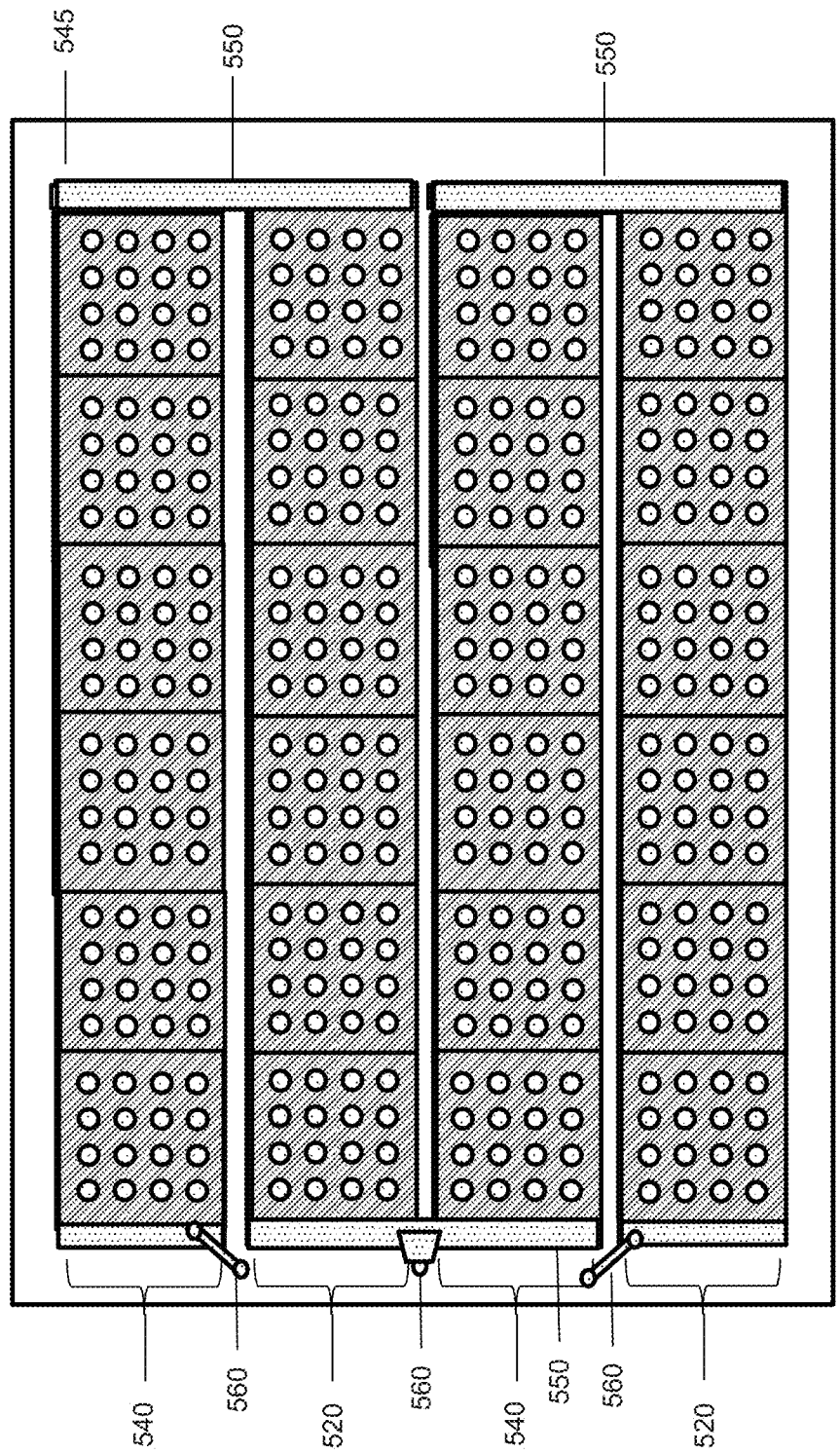

FIGS. 5F-5I are sequential diagrams showing examples of the production of a rear-contact PV module. Sets of interconnect strings 520 and 540 are attached to a backsheet 545 prior to attachment of the rear-contact solar cells as shown in FIG. 5F. Although a single tool such as the apparatus shown in FIG. 5B may be used to make interconnect strings 520 and 540, in some embodiments, the two strings must be rotated 180 degrees relative to each other before being attached to the backsheet 545. The distance between interconnect strings 520 and 540 should generally be minimized while taking into account an offset necessary to avoid electrical shorts between adjacent interconnect strings and/or rear-contact solar cells. Connecting busbars 550 are used to electrically connect adjacent interconnect strings 520 and 540 as shown in FIG. 5G. The connecting busbars 550 may be soldered, welded, bonded using ECA, or attached via other means to the ends of the interconnect strings 520 and 540. It may be possible to use commercially available busing equipment such as one available from Spire Solar (Bedford, Mass.) to attach the connecting busbars 550. In FIG. 5H, external electrical connections 560 enable electrical current to flow out of the module. The external electrical connections 560 may be used to connect bypass diodes, a junction box, or other electronic devices to the solar module. Once an interconnect backsheet comprising the components shown in FIG. 5H has been fabricated, it may be stored in sheet or roll form prior to subsequent process steps.

Figure 5I:
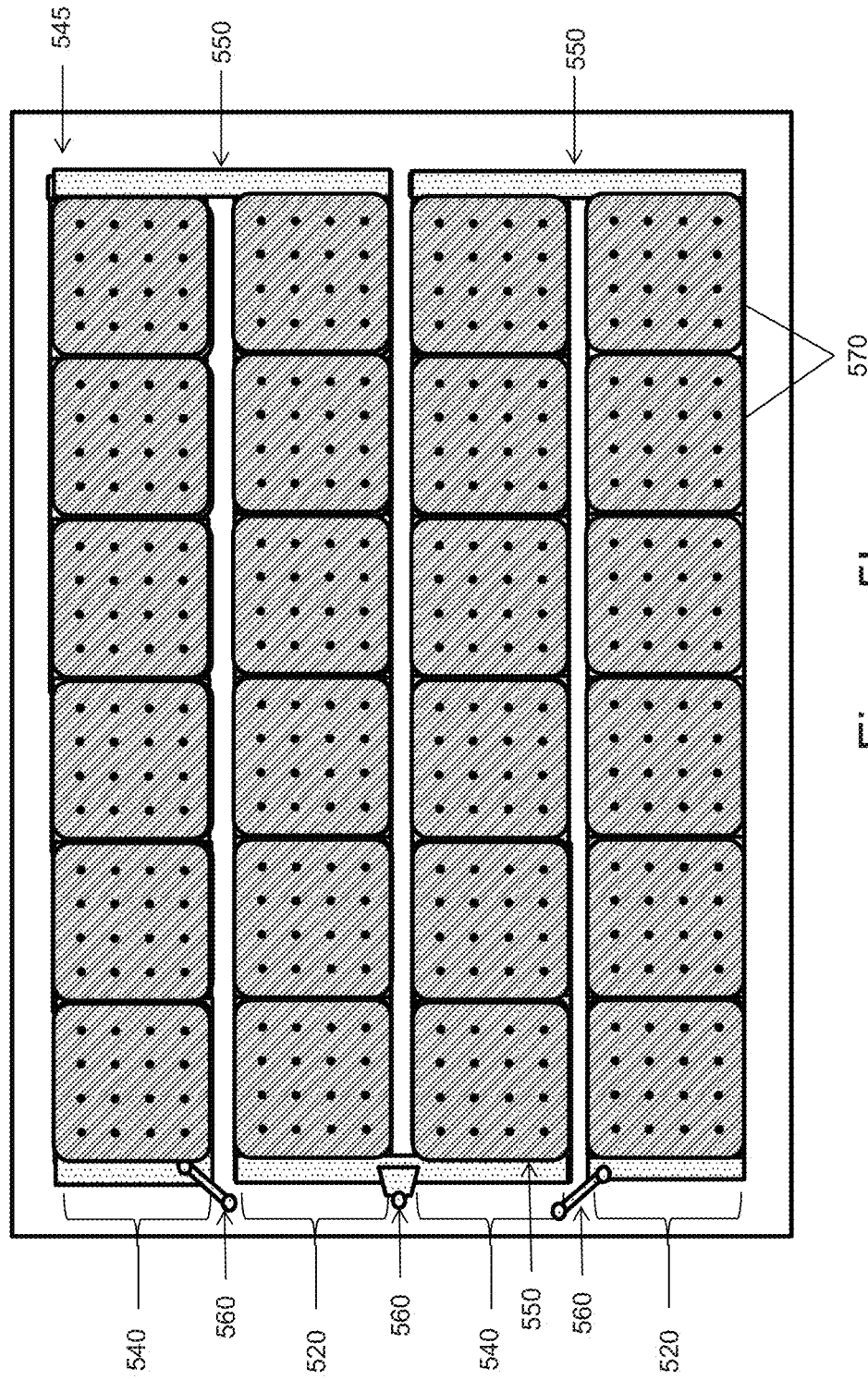

Rear-contact solar cells 570 are electrically connected and attached to the interconnect backsheet in FIG. 5I. As described previously, ECAs, solder, or other materials may be used to make the electrical connections between the rear-contact solar cells and the interconnect backsheet. Optionally, an additional adhesive layer may be used to provide increased mechanical support. These materials may first be applied to the rear-contact solar cells 570, to the interconnect backsheet, or to a combination of the two. Once the rear-contact solar cells 570, connecting busbars 550, and external electrical connections 560 have been attached to the interconnect backsheet, an encapsulant-covered front glass cover sheet may be placed on top of the rear-contact solar cells 570 and the interconnect backsheet, and a turning unit (commercially available from Eurotron BV) may be used to turn over the module stack so that the front glass cover sheet is face down. The module stack may then be laminated using a clamshell vacuum laminator (e.g., using one commercially available from Spire), and conventional front-contact solar module assembly techniques such as framing and attachment of a junction box may then be used to complete the rear-contact solar module.

Figure 6B:
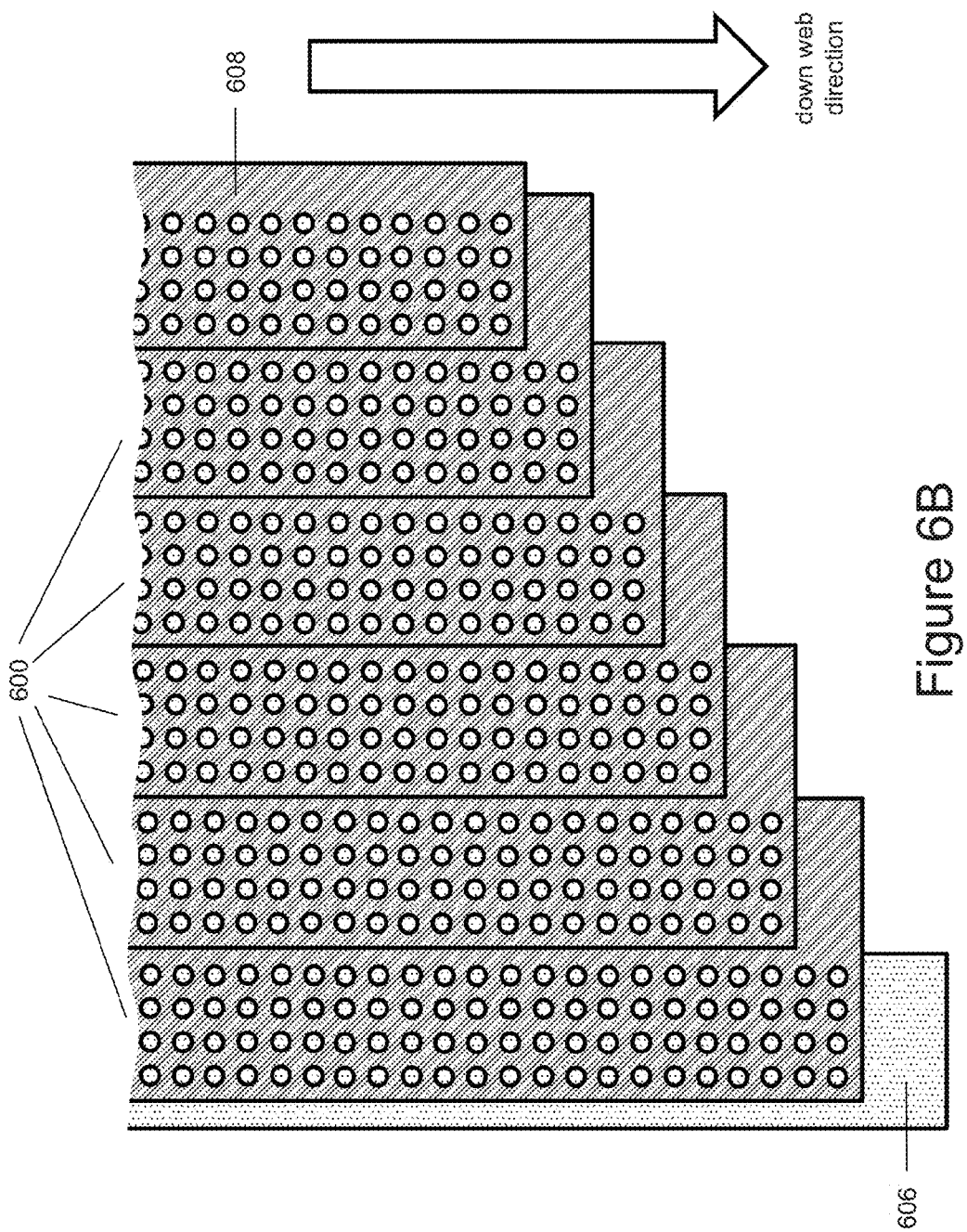

In some embodiments, interconnect strings and/or interconnect backsheets are fabricated using roll-to-roll techniques that generally give higher throughput than the apparatus shown in FIG. 5B. FIGS. 6A-6E are sequential diagrams showing examples of the production of an electrically-functional interconnect backsheet. FIG. 6A shows a base substrate 600 comprising a plated, adhesive-coated sheet of conductive foil/insulating layer laminate 602 that has been patterned with an array of gaps or holes 604 over a portion of the substrate. In some embodiments, the pattern of gaps or holes 604 matches the pattern of second polarity contacts on the rear-contact solar cells that are to be attached to the interconnect strings and/or the interconnect backsheet. The cross-web width of the base substrate 600 is roughly twice the width of the rear-contact solar cells. In FIG. 6B, several base substrates 600 are aligned using roll-to-roll processing equipment to form a partially overlapping pattern. The base substrates 600 are laminated so that roughly one half of each base substrate 600 is overlapped with an adjacent base substrate. The exact degree of overlap may be adjusted based on other system requirements such as the desired spacing of the rear-contact cells and the avoidance of shunt formation at the foil edges. As shown in FIG. 6B, other sections of plated, patterned, and adhesive-coated sheets of conductive foil/insulating layer laminate are cut and patterned to form first substrate 606 and final substrate 608. The cross-web width of the first and final substrates 606 and 608 may be slightly larger than the width of a rear-contact solar cell. The first and final substrates 606 and 608 are aligned with roughly the same distance of overlap as the base substrates 600.

Figure 6C:
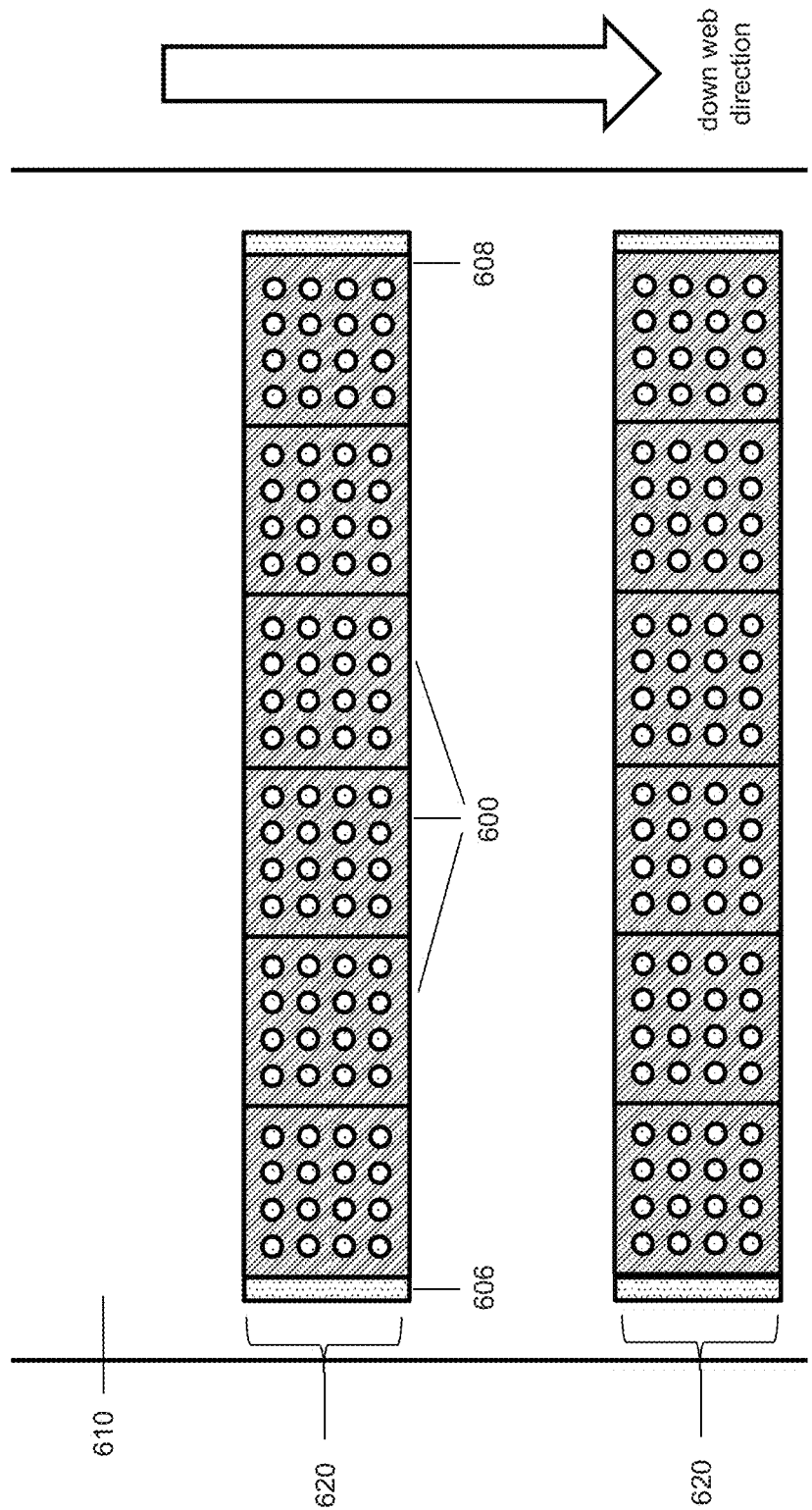
Figure 6D:
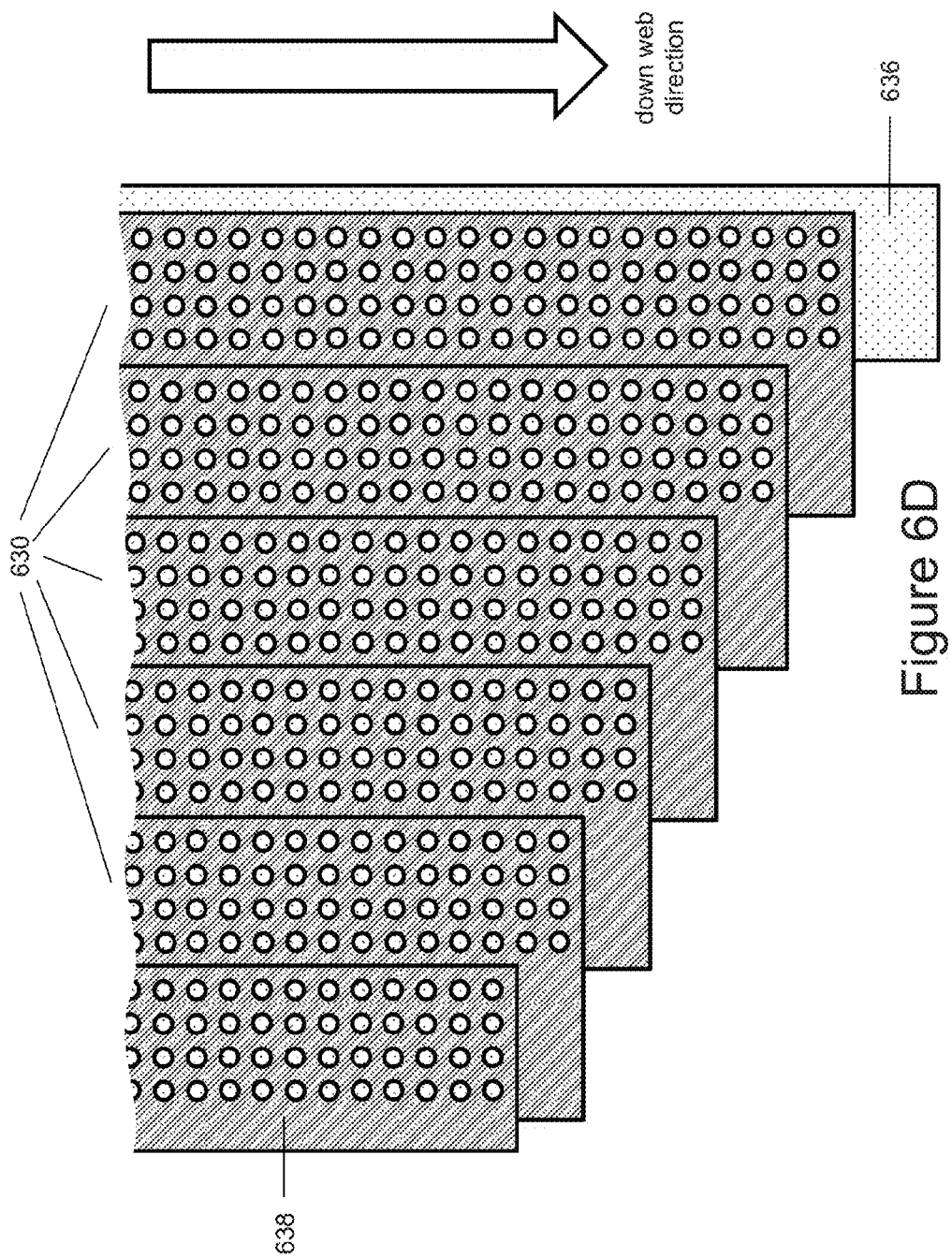

In some embodiments, first substrate 606, base substrates 600, and final substrate 608 are laminated together in a partially-overlapping pattern using a nip roller, and are then singulated to form one or more interconnect strings 620 as shown in FIG. 6C. At this point in the process, the interconnect strings may optionally be removed from the roll-to-roll processing apparatus and may be used in the process sequences described previously for the interconnect strings 520 shown in FIG. 5C.

Figure 6E:
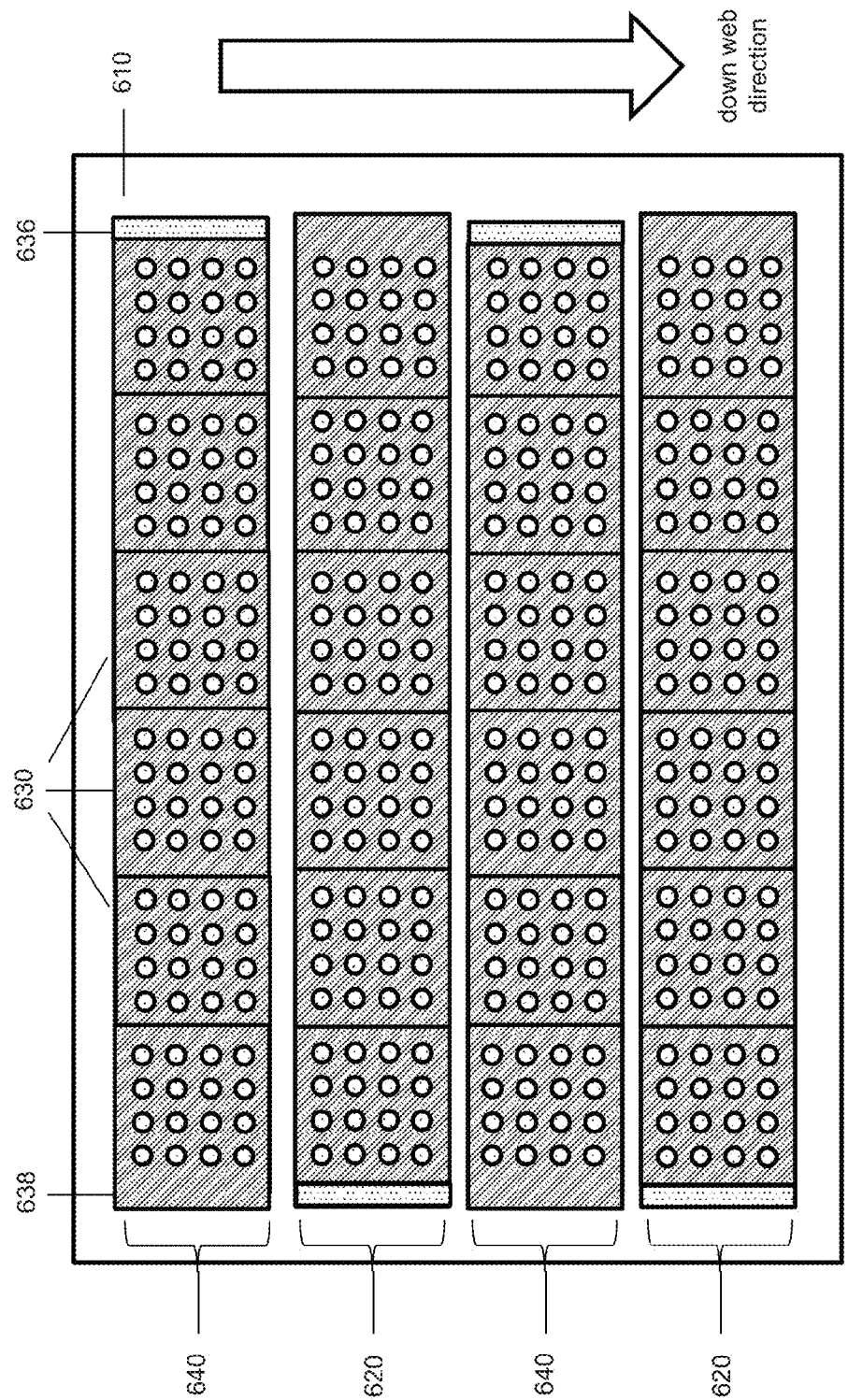

In another embodiment as further depicted in FIG. 6C, the first substrate 606, the base substrates 600, and the final substrate 608 are laminated together (e.g., using a nip roller) to form interconnect strings 620, and in parallel the interconnect strings 620 are laminated to a backsheet 610 using a mechanically registered roll-to-roll process apparatus. This may have the advantage of simplifying the alignment between the interconnect strings 620 and the backsheet 610. In addition, the roll-to-roll process apparatus may be designed so that open spaces or gaps are created between each interconnect string 620 on the backsheet 610. Next, in FIG. 6D, a reverse partially-overlapping pattern comprising a first reverse substrate 636, base reverse substrates 630, and a final reverse substrate 638 are made in another section of the roll-to-roll processing apparatus. The first reverse substrate 636, base reverse substrates 630, and final reverse substrate 638 are similar to the first substrate 606, base substrates 600, and final substrate 608, respectively, except that the array of gaps or holes is formed relative to the opposite edge of the substrate, and the orientation of the overlap of the reverse substrates 636, 630, and 638 is the opposite of the orientation of the overlap of the substrates 606, 600, and 608. In FIG. 6E, the first reverse substrate 636, the base reverse substrates 630, and the final reverse substrate 638 have been laminated together (e.g., using a nip roller) to form reverse interconnect strings 640, and in parallel the reverse interconnect strings 640 are laminated to the backsheet 610 using a mechanically registered roll-to-roll process apparatus. The roll-to-roll process apparatus is designed so that the reverse interconnect strings 640 are laminated in regions where there are open spaces or gaps between interconnect strings 620. Once an interconnect backsheet comprising interconnect strings 620, reverse interconnect strings 640, and the backsheet 610 has been fabricated as shown in FIG. 6E, processes described above and depicted in FIGS. 5E-5G may be used to electrically bus interconnect strings 620 to adjacent reverse interconnect strings 640, attach the rear-contact solar cells, and complete the rear-contact PV module.

Figure 7A:
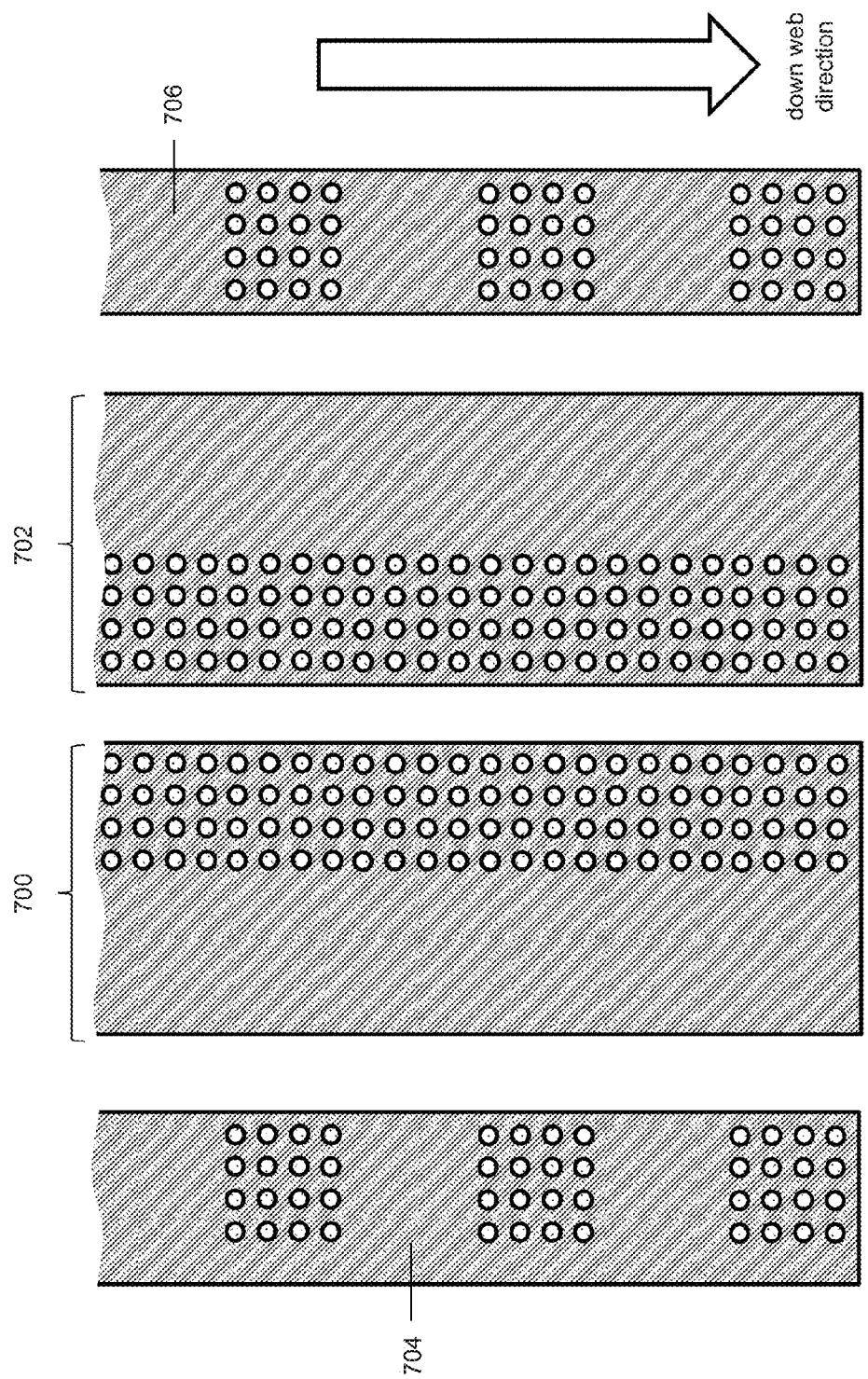
FIGS. 7A-7F are sequential diagrams showing examples of the production of an electrically-functional interconnect backsheet with no connecting busbars.
Figure 7B:
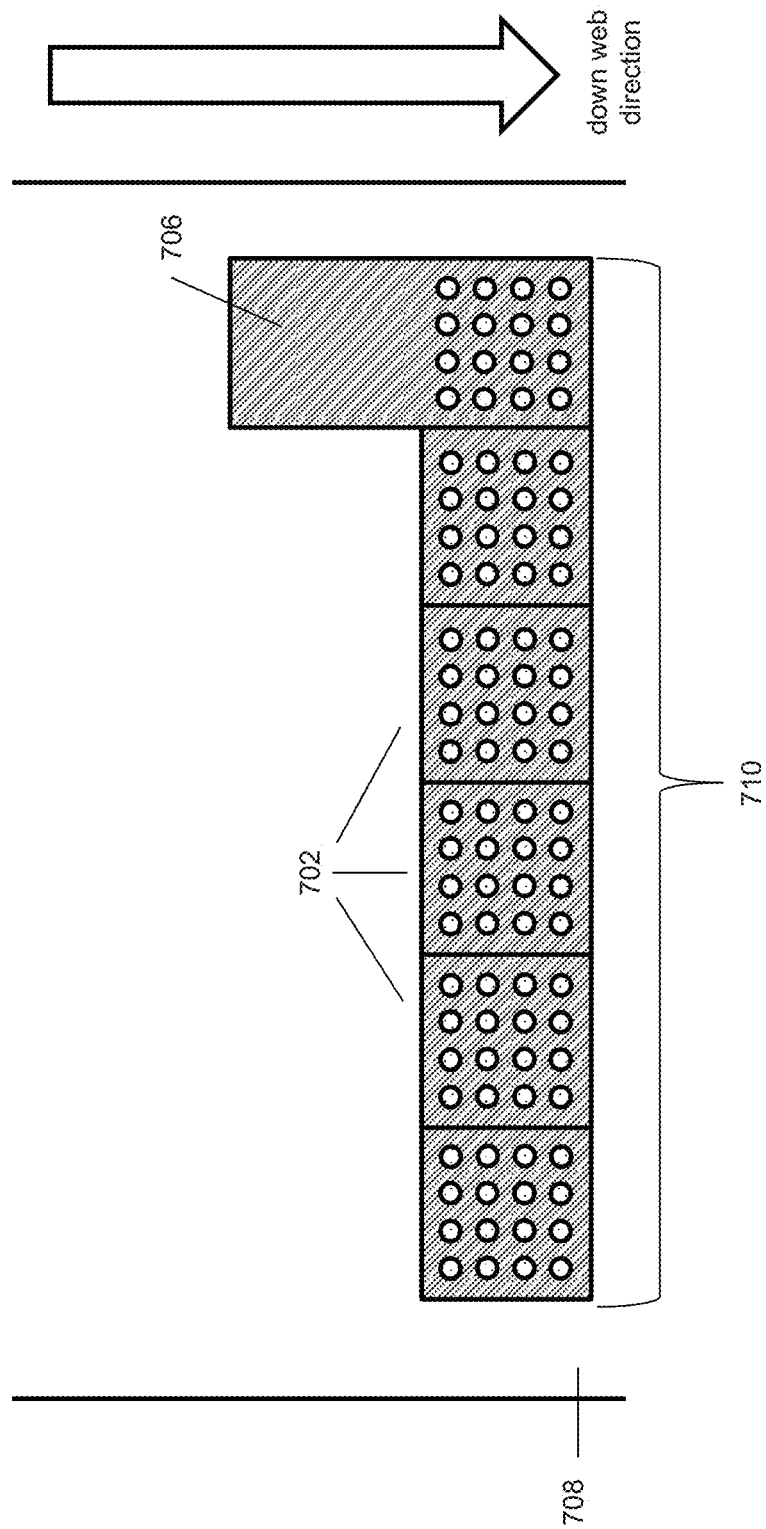
Figure 7C:
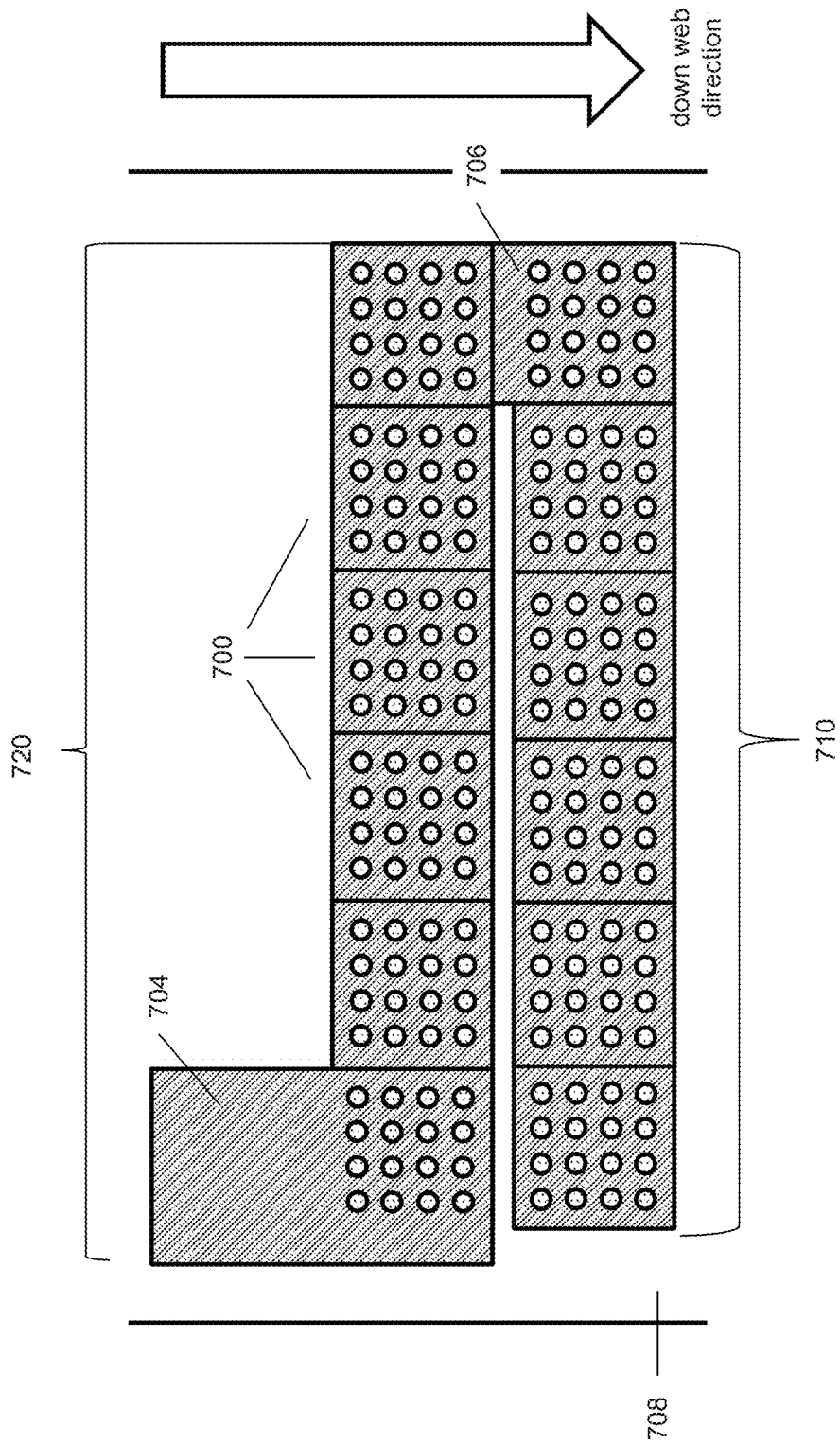
Figure 7D:
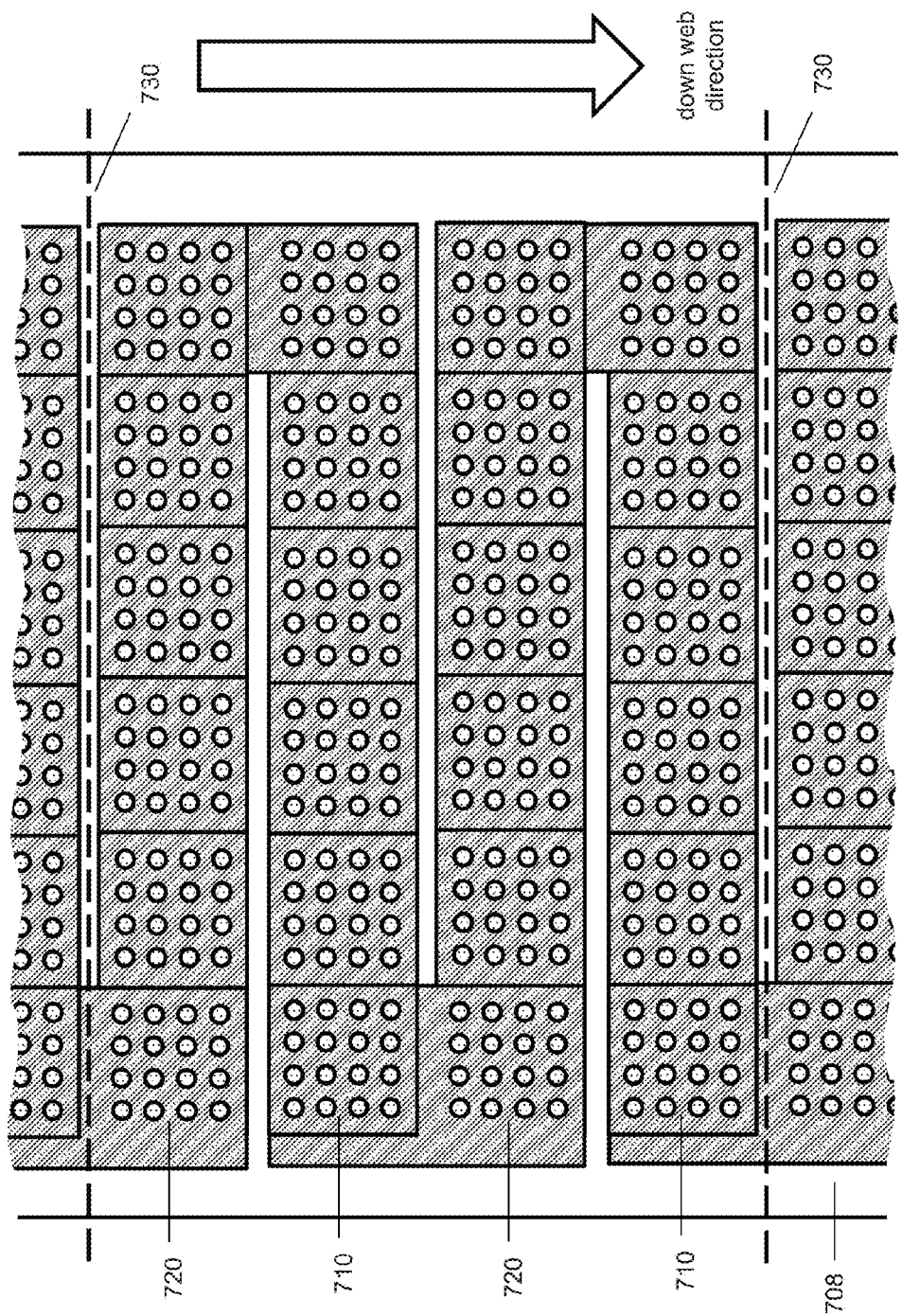
Figure 7E:
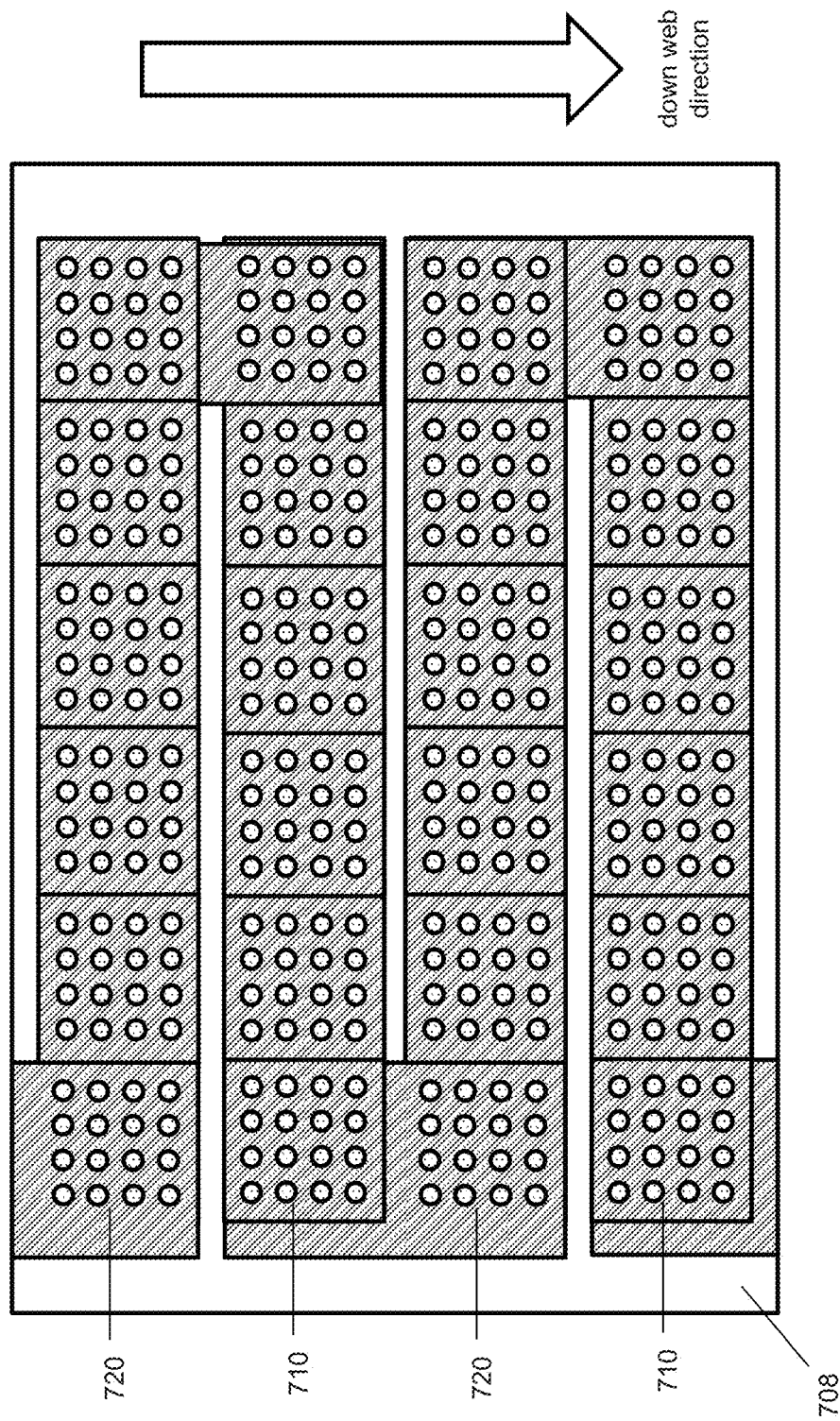
Figure 7F:
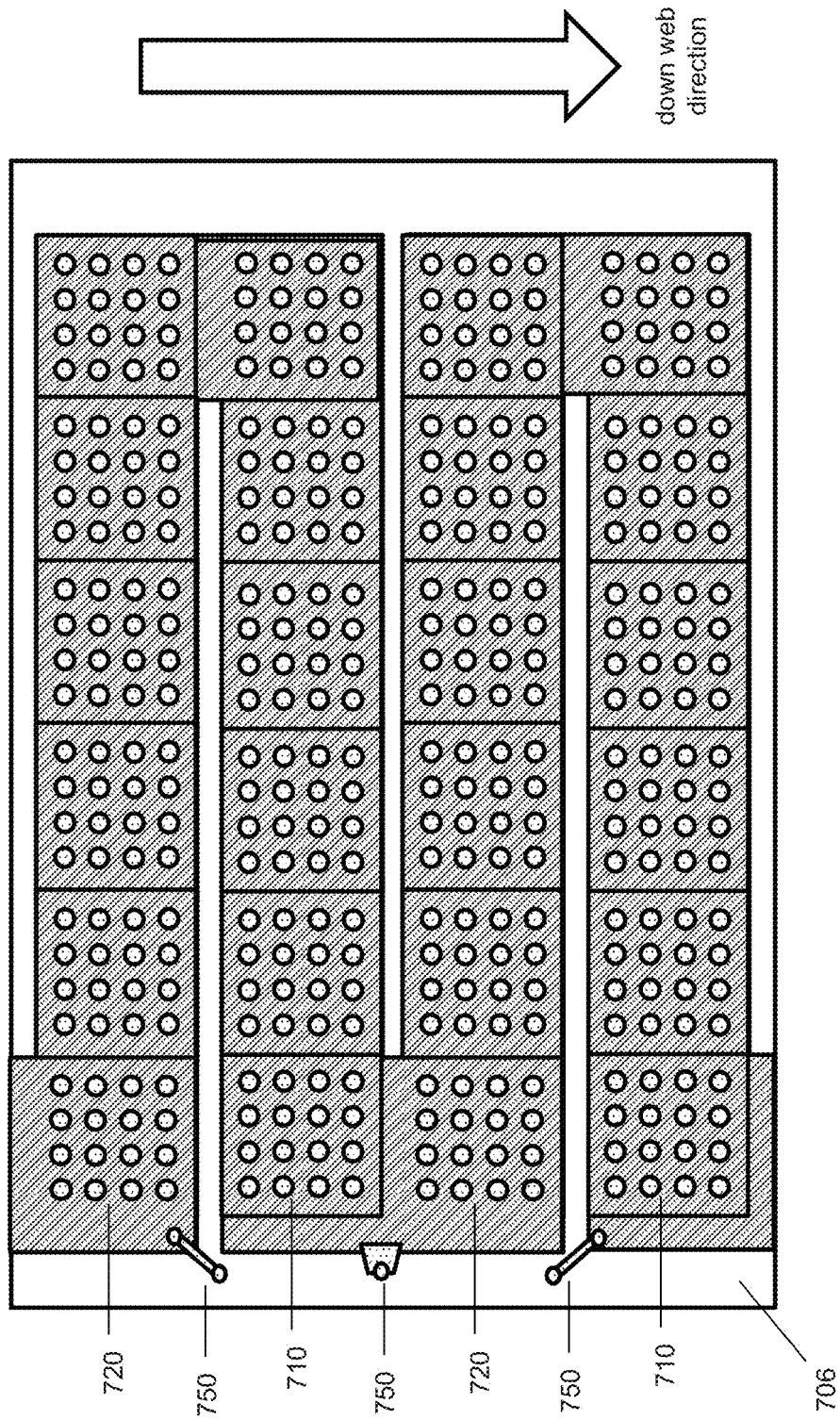

Additional lamination patterns and techniques may be used to eliminate the need for some or all of the busbars in the rear-contact PV module. FIGS. 7A-7F are sequential diagrams showing examples of the production of an electrically functional interconnect backsheet with no connecting busbars. FIG. 7A shows a base substrate 700, a reverse base substrate 702, top substrate 704, and a bottom substrate 706 which comprise plated, patterned, and adhesive-coated sheets of conductive foil/insulating layer laminate. The cross-web width of the top substrate 704 is slightly larger than the width of a rear-contact solar cell, the cross-web widths of the base substrate 700 and the reverse base substrate 702 are approximately twice the width of a rear-contact solar cell, and the cross-web width of the bottom substrate 706 is approximately the same as the width of a rear-contact solar cell. As shown in FIG. 7B, one or more reverse base substrates 702 and the bottom substrate 706 may be singulated and laminated together to form a first L-shaped interconnect string 710. The first L-shaped interconnect string 710 may optionally be laminated to a backsheet 708. Next, as shown in FIG. 7C, one or more base substrates 700 and the top substrate 704 may be laminated together to form a second L-shaped interconnect string 720, which is then laminated to the backsheet 708 such that the exposed surface of the bottom substrate 706 in the first L-shaped interconnect string 710 is covered by the second L-shaped interconnect string 720. This lamination pattern may be repeated by alternately placing first L-shaped interconnect strings 710 and second L-shaped interconnect strings 720 on the backsheet 708 as shown in FIG. 7D. Because the cross-web width of the top substrate 704 in the first L-shaped interconnect string 710 is slightly larger than the width of a rear-contact solar cell, a portion of the top substrate 704 will remain exposed beyond the edges of the rear-contact cells once the cells have been attached to the interconnect backsheet. Next, the backsheet may be cut along cut lines 730 to form singulated interconnect backsheets as shown in FIG. 7E. The interconnect backsheets may then be used in the fabrication of individual rear-contact PV modules. External electrical connections 750 may be made to the exposed edges of top substrates 704 as shown in FIG. 7F either before or after attachment of the rear-contact solar cells. Although not specifically depicted in FIGS. 7A-7F, in some embodiments the L-shaped interconnect strings 710 are attached to rear-contact cells before the interconnect strings 710 have been laminated to the backsheet 708. For example, the L-shaped interconnect strings 710 may be attached to the rear-contact cells after the cells have been placed face down on an encapsulant-covered front glass cover sheet. In this embodiment it may be possible to fold back the exposed edges of the top substrates 704 so that the external electrical connections 750 are effectively made behind the rear-contact cells rather than adjacent to them. This approach has the benefit of reducing the inactive area of the front surface of the module. The electrical connections may then be routed out of the module through holes in a subsequently-laminated conventional backsheet.

Figure 8:
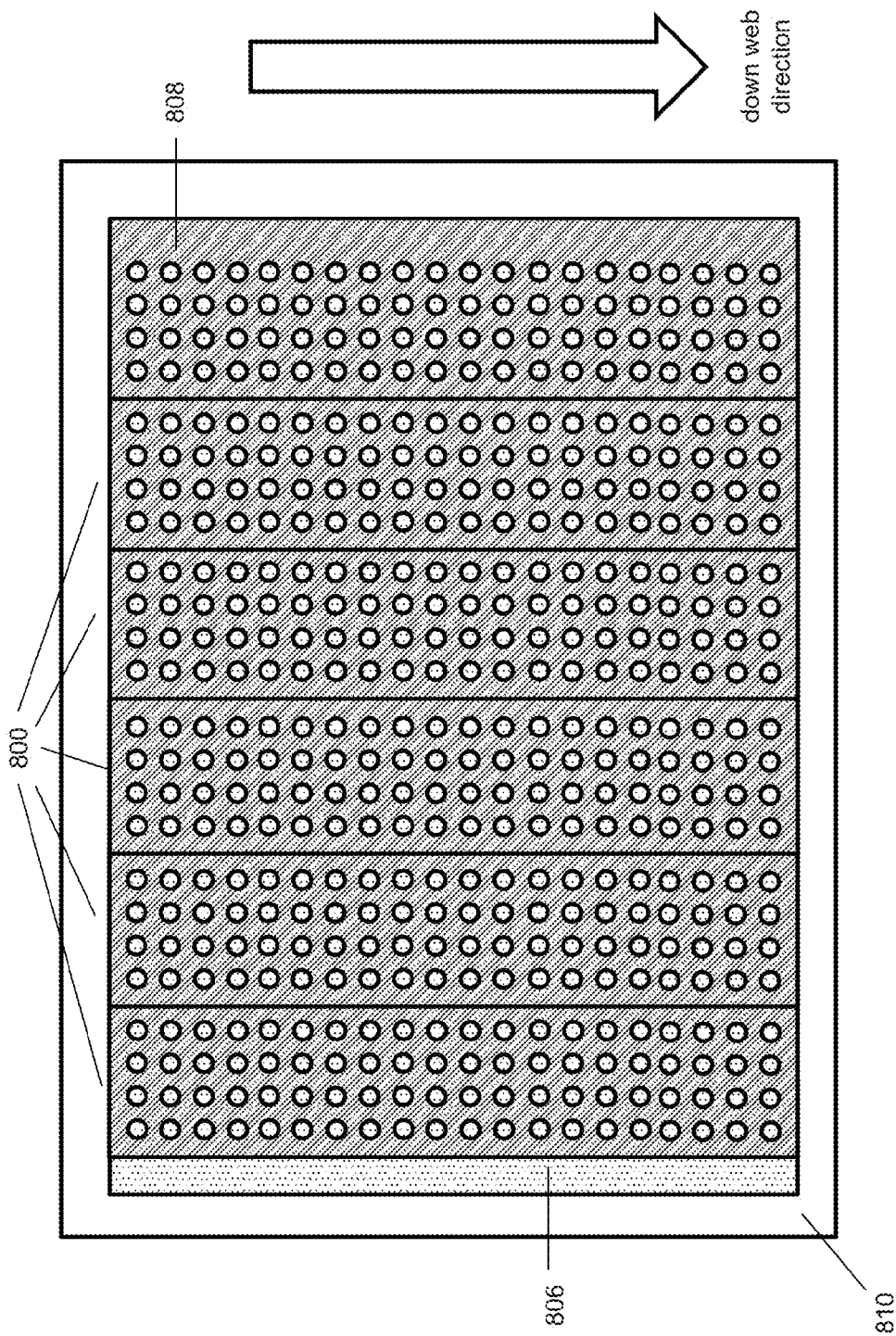
FIG. 8 is a diagram illustrating an example of an electrically-functional interconnect backsheet that enables a series-parallel solar cell interconnection to be made in a rear-contact PV module.

In some embodiments, a PV module comprises a series-parallel connection between rear-contact solar cells. FIG. 8 is a diagram illustrating an example of an electrically-functional interconnect backsheet that enables a series-parallel solar cell interconnection to be made in a rear-contact PV module. Base substrate 800 comprises a plated, adhesive-coated sheet of conductive foil/insulating layer laminate that has been patterned with an array of gaps or holes over a portion of the substrate. In some embodiments, the pattern of gaps or holes matches the pattern of second polarity contacts on the rear-contact solar cells that are to be attached to the conductive foil and/or the interconnect backsheet. The cross-web width of the base substrates 800 is roughly twice the width of a rear-contact solar cell, while the length of the base substrates 800 following singulation is at least twice the length of a rear-contact solar cell. First substrate 806 is similar to base substrates 800 except that there are no holes in the first substrate 806, and the cross-web width of the first substrate 806 is slightly larger than the width of a rear-contact solar cell. Similarly, final substrate 808 is similar to base substrates 800 except that the cross-web width of the final substrate 808 is slightly larger than the width of a rear-contact solar cell. As shown in FIG. 8, first substrate 806, base substrates 800, and final substrate 808 are laminated to form a partially overlapping pattern. The substrates 806, 800 and 808 may be laminated together using a roll-to-roll process apparatus as described in other embodiments. In addition, the substrates 806, 800 and 808 may optionally be laminated to a backsheet 810. Once the interconnect backsheet shown in FIG. 8 has been fabricated, processes described above and depicted in FIGS. 5F-5G may be used to attach the rear-contact solar cells and complete the solar module.

Whereas in other embodiments the conductive foils have been sized and patterned to interconnect rear-contact solar cells in a linear or serpentine configuration, in the embodiments described in FIG. 8 each conductive foil rectangle spans the length of several rear-contact solar cells in the down-web direction. In this configuration, each conductive foil rectangle in the string connects several rear-contact solar cells in parallel, while the partially-overlapping pattern of conductive foil rectangles connects each group of parallel-connected rear-contact solar cells in series. A series-parallel connection of rear-contact solar cells may be advantageous for increasing the current and reducing the voltage output of the rear-contact PV module. This may be beneficial if the module is to be used in large utility-scale installations, for example.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A rear-contact solar cell interconnect assembly comprising:
   a first rear-contact solar cell comprising a first polarity contact and a second polarity contact,
   a second rear-contact solar cell comprising a third polarity contact and a fourth polarity contact,
   a first interconnect comprising a first conductive foil having a first conductive foil opening,
      the first interconnect further comprising a first insulating layer having a first insulating layer opening aligned with the first conductive foil opening; and
   a second interconnect comprising a second conductive foil and a second insulating layer,
      wherein the first interconnect is disposed between the first rear-contact solar cell and the second interconnect,
      wherein the first conductive foil of the first interconnect faces the first rear-contact solar cell, and
      wherein the second conductive foil of the second interconnect faces the first insulating layer of the first interconnect;
   a first electrical connection extending between the first conductive foil and the first polarity contact of the first rear-contact solar cell;
   a second electrical connection extending between the second conductive foil and the second polarity contact of the first rear-contact solar cell, the second electrical connection protruding through the first conductive foil opening of the first conductive foil and the first insulating layer opening of the first insulating layer; and
   a third electrical connection extending between the second conductive foil and the third polarity contact of the second rear-contact solar cell.

2. The rear-contact solar cell interconnect assembly recited in claim 1, wherein a width of the first conductive foil opening of the first conductive foil is at least 25% larger than a critical feature size of the second electrical connection protruding through the first conductive foil opening of the first conductive foil.

3. The rear-contact solar cell interconnect assembly recited in claim 1, wherein the first insulating layer opening is smaller than the first conductive foil opening such that the first insulating layer extends over a portion of the first conductive foil opening of the first conductive foil.

4. The rear-contact solar cell interconnect assembly recited in claim 1, wherein the first conductive foil comprises one or more materials selected from the group consisting of aluminum, copper, steel, titanium, molybdenum, and tungsten.

5. The rear-contact solar cell interconnect assembly recited in claim 1, wherein a thickness of the first conductive foil is approximately between 10 micrometers and 200 micrometers.

6. The rear-contact solar cell interconnect assembly recited in claim 1, wherein the first rear-contact solar cell comprises silicon.

7. The rear-contact solar cell interconnect assembly recited in claim 1, wherein the second electrical connection comprises a material selected from the group consisting of a solder, a conductive ink, an isotropic electrically conductive adhesive, and a anisotropic electrically conductive adhesive.

8. A rear-contact solar cell interconnect assembly comprising:
 a first interconnect comprising a first conductive foil having a first conductive foil opening,
  the first interconnect further comprising a first insulating layer having a first insulating layer opening aligned with the first conductive foil opening,
  wherein the first insulating layer is mechanically coupled to a back surface of the first conductive foil; and
 a second interconnect comprising a second conductive foil and a second insulating layer,
  wherein the second conductive foil of the second interconnect faces the first insulating layer of the first interconnect, and
  wherein a portion of the second conductive foil is mechanically coupled to a portion of the first insulating layer;
  wherein the first conductive foil and the first insulating layer are arranged to be mechanically coupled to a first rear-contact solar cell,
  wherein the second conductive foil and the second insulating layer are arranged to be mechanically coupled to a second rear-contact solar cell,
  wherein the first conductive foil is arranged to be electrically connected to a first polarity contact on a rear side of the first rear-contact solar cell using a first electrical connection,
  wherein the second conductive foil is arranged to be electrically connected to a second polarity contact on the rear side of the first rear-contact solar cell using a second electrical connection protruding through the first conductive foil opening of the first conductive foil and the first insulating layer opening of the first insulating layer, and
  wherein the second conductive foil is arranged to be electrically connected to a third polarity contact on a rear side of the second rear-contact cell using a third electrical connection.

9. The rear-contact solar cell interconnect assembly recited in claim 8, further comprising a backsheet mechanically supporting the first conductive foil, the first insulating layer, the second conductive foil, and the second insulating layer.

10. The rear-contact solar cell interconnect assembly recited in claim 8, wherein the first conductive foil comprises a surface finish, wherein the surface finish comprises a material selected from the group consisting of tin, lead, nickel, silver, palladium, gold, indium, and alloys thereof.

11. The rear-contact solar cell interconnect assembly recited in claim 8, further comprising an adhesive layer disposed between the first interconnect and the second interconnect, wherein the adhesive layer directly interfaces the first insulating layer of the first interconnect and the second conductive layer of the second interconnect, and wherein the adhesive layer mechanically couples the portion of the second conductive foil and the portion of the first insulating layer.

12. The rear-contact solar cell interconnect assembly recited in claim 8, further comprising an insulating sidewall coating disposed on at least a sidewall of the first conductive foil opening of the first conductive foil for electrically insulating the second electrical connection from the first conductive foil.

13. The rear-contact solar cell interconnect assembly recited in claim 8, further comprising an adhesive layer disposed on a surface of the first conductive foil facing away from the first insulating layer.

14. The rear-contact solar cell interconnect assembly recited in claim 8, wherein the first insulating layer comprises polyethylene terephthalate.

15. A method for fabricating a rear-contact solar cell interconnect assembly, the method comprising:
 providing a first interconnect comprising a first conductive foil having a first conductive foil opening,
  the first interconnect further comprising a first insulating layer having a first insulating layer opening aligned with the first conductive foil opening,
  wherein the first insulating layer is mechanically coupled to a back surface of the first conductive foil;
 providing a second interconnect comprising a second conductive foil and a second insulating layer; and
 mechanically coupling a portion of the first insulating layer to a portion of the second conductive foil,
  wherein the first interconnect is arranged to be mechanically coupled to a first rear-contact solar cell,
  wherein the second interconnect is arranged to be mechanically coupled to a second rear-contact solar cell,
  wherein the first conductive foil is arranged to be electrically connected to a first polarity contact on a rear side of the first rear-contact solar cell using a first electrical connection,
  wherein the second conductive foil is arranged to be electrically connected to a second polarity contact on the rear side of the first rear-contact solar cell using a second electrical connection protruding through the first conductive foil opening of the first conductive foil and the first insulating layer opening of the first insulating layer, and
  wherein the second conductive foil is arranged to be electrically connected to a third polarity contact on a rear side of the second rear-contact cell using a third electrical connection.

16. The method of claim 15, further comprising
 forming the first electrical connection extending between the first conductive foil and the first polarity contact of the first solar rear-contact cell,
 forming the second electrical connection extending between the second conductive foil and the second polarity contact of the first solar rear-contact cell,
  the second electrical connection protruding through the first conductive foil opening of the first conductive foil and the first insulating layer opening of the first insulating layer, and
 mechanically coupling the first interconnect to the first rear-contact cell.

17. The method of claim 15, further comprising forming the third electrical connection extending between the second conductive foil and the third polarity contact of the second rear-contact solar cell and mechanically coupling the second interconnect to the second rear-contact cell.

18. The method of claim 15, further comprising forming the first conductive foil opening and the first insulating layer opening using a process selected from the group consisting of rotary die punching and laser cutting.

19. The method of claim 15, further comprising forming the first conductive foil opening and the first insulating layer opening in the same operation.

20. The method of claim 15, further comprising, prior to coupling the portion of the first insulating layer to the portion of the second conductive foil, forming an adhesive layer on a surface the first insulating layer facing away from the first conductive foil.

21. The method of claim 15, wherein mechanically coupling the portion of the first insulating layer to the portion of the second conductive foil comprises aligning the first interconnect with respect to the second interconnect using a roll-to-roll technique such that an overlap between the portion of the first insulating layer and the portion of the second conductive foil is formed in a cross-web direction.

22. The method of claim 15, wherein mechanically coupling the portion of the first insulating layer to the portion of the second conductive foil comprises forming an overlap between the portion of the first insulating layer and the portion of the second conductive foil in a direction of a web.

* * * * *